US009172059B2

United States Patent
Seo et al.

(10) Patent No.: US 9,172,059 B2
(45) Date of Patent: Oct. 27, 2015

(54) LIGHT-EMITTING DEVICE AND ELECTRONIC DEVICE USING LIGHT-EMITTING DEVICE

(75) Inventors: Satoshi Seo, Kanagawa (JP); Toshiki Sasaki, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 72 days.

(21) Appl. No.: 13/371,107

(22) Filed: Feb. 10, 2012

(65) Prior Publication Data

US 2012/0206675 A1 Aug. 16, 2012

(30) Foreign Application Priority Data

Feb. 11, 2011 (JP) ................... 2011-027967

(51) Int. Cl.
*H01L 51/50* (2006.01)
*H01L 51/52* (2006.01)
*H01L 27/32* (2006.01)
(Continued)

(52) U.S. Cl.
CPC ........ *H01L 51/5265* (2013.01); *H01L 27/3211* (2013.01); *H05B 33/22* (2013.01); *H01L 27/1225* (2013.01); *H01L 27/322* (2013.01); *H01L 27/3232* (2013.01); *H01L 27/3244* (2013.01)

(58) Field of Classification Search
CPC ........ H01L 51/5278; H01L 51/5088–51/5092; H01L 51/5036–51/5044; H01L 27/3213
See application file for complete search history.

(56) References Cited

U.S. PATENT DOCUMENTS 5,554,911 A   9/1996   Nakayama et al.
6,831,408 B2  12/2004  Hirano et al.
6,847,163 B1  1/2005   Tsutsui et al.
(Continued)

FOREIGN PATENT DOCUMENTS

JP    6-275381     9/1994
JP    2001-43980   2/2001
(Continued)

OTHER PUBLICATIONS

Matsumoto, T. et al, "27.5L: Late-News Paper: Multiphoton Organic El Device Having Charge Generation Layer," SID Digest '03: SID International Symposium Digest of Technical Papers, vol. 34, 2003, pp. 979-981.

(Continued)

*Primary Examiner* — Mariceli Santiago
(74) *Attorney, Agent, or Firm* — Husch Blackwell LLP

(57) ABSTRACT

First to third light-emitting elements each including a reflection electrode layer, a transflective electrode layer, and a light-emitting layer provided therebetween are provided. In the first light-emitting element, the light-emitting layer is in contact with the reflection electrode layer and the transflective electrode layer. In the second light-emitting element, a first transparent electrode layer is in contact with the reflection electrode layer, the light-emitting layer is in contact with the first transparent electrode layer and the transflective electrode layer. In the third light-emitting element, a second transparent electrode layer is in contact with the reflection electrode layer, the light-emitting layer is in contact with the second transparent electrode layer and the transflective electrode layer. The first transparent electrode layer is different form the second transparent electrode layer in thickness.

18 Claims, 9 Drawing Sheets

(51) Int. Cl.
 *H05B 33/22* (2006.01)
 *H01L 27/12* (2006.01)

(56) References Cited

U.S. PATENT DOCUMENTS

| | | |
|---|---|---|
| 7,030,553 B2 | 4/2006 | Winters et al. |
| 7,271,537 B2 | 9/2007 | Matsuda et al. |
| 7,317,282 B2 | 1/2008 | Tsutsui et al. |
| 7,462,883 B2 | 12/2008 | Kumaki et al. |
| 7,548,019 B2 | 6/2009 | Omura et al. |
| 7,554,265 B2 | 6/2009 | Godo et al. |
| 7,564,052 B2 | 7/2009 | Kumaki et al. |
| 7,601,988 B2 | 10/2009 | Seo et al. |
| 7,737,626 B2 | 6/2010 | Kumaki et al. |
| 7,753,751 B2 | 7/2010 | Yamazaki |
| 7,851,989 B2 | 12/2010 | Noda |
| 7,875,893 B2 | 1/2011 | Seo et al. |
| 7,893,427 B2 | 2/2011 | Kumaki et al. |
| 7,964,891 B2 | 6/2011 | Kumaki et al. |
| 7,973,319 B2 | 7/2011 | Kashiwabara et al. |
| 8,008,652 B2 | 8/2011 | Kumaki et al. |
| 8,080,934 B2 | 12/2011 | Kido et al. |
| 2003/0189401 A1 | 10/2003 | Kido et al. |
| 2005/0084712 A1* | 4/2005 | Kido et al. ............ 313/504 |
| 2005/0098207 A1 | 5/2005 | Matsumoto et al. |
| 2005/0218799 A1 | 10/2005 | Hamada |
| 2005/0225232 A1* | 10/2005 | Boroson et al. ......... 313/504 |
| 2005/0248267 A1 | 11/2005 | Gyoutoku et al. |
| 2006/0163597 A1 | 7/2006 | Noda et al. |
| 2006/0267483 A1 | 11/2006 | Tsutsui et al. |
| 2006/0284204 A1 | 12/2006 | Yamazaki et al. |
| 2007/0001570 A1 | 1/2007 | Nomura et al. |
| 2007/0085075 A1 | 4/2007 | Yamazaki et al. |
| 2007/0102737 A1 | 5/2007 | Kashiwabara et al. |
| 2007/0176161 A1 | 8/2007 | Seo et al. |
| 2008/0006821 A1* | 1/2008 | Suzuki et al. .............. 257/40 |
| 2008/0241586 A1 | 10/2008 | Kumaki et al. |
| 2009/0275161 A1 | 11/2009 | Kumaki et al. |
| 2010/0176720 A1 | 7/2010 | Yamazaki |
| 2011/0062475 A1 | 3/2011 | Cho |
| 2011/0073885 A1* | 3/2011 | Kim et al. .................. 257/89 |
| 2011/0101345 A1 | 5/2011 | Kumaki et al. |
| 2011/0101380 A1 | 5/2011 | Kumaki et al. |
| 2011/0108864 A1 | 5/2011 | Seo et al. |
| 2011/0140101 A1 | 6/2011 | Noda |
| 2011/0180794 A1* | 7/2011 | Yamazaki .................. 257/43 |
| 2011/0187259 A1 | 8/2011 | Fukuda et al. |
| 2011/0187260 A1 | 8/2011 | Fukuda et al. |
| 2011/0241007 A1 | 10/2011 | Kumaki et al. |
| 2011/0278562 A1 | 11/2011 | Kumaki et al. |
| 2011/0291088 A1 | 12/2011 | Seo et al. |
| 2011/0309351 A1 | 12/2011 | Kumaki et al. |
| 2012/0126272 A1 | 5/2012 | Kurata et al. |
| 2012/0181921 A1 | 7/2012 | Ono |
| 2012/0205676 A1 | 8/2012 | Seo et al. |
| 2012/0205685 A1 | 8/2012 | Seo et al. |
| 2012/0205686 A1 | 8/2012 | Seo et al. |

FOREIGN PATENT DOCUMENTS

| | | |
|---|---|---|
| JP | 2005-93401 | 4/2005 |
| JP | 2006-32327 | 2/2006 |
| JP | 2006-126817 | 5/2006 |
| JP | 2007-503093 | 2/2007 |
| JP | 2009-266459 | 11/2009 |
| JP | 2009-266524 | 11/2009 |
| JP | 2010-3577 | 1/2010 |

OTHER PUBLICATIONS

Kashiwabara, M. et al, "29.5L: Late-News Paper: Advanced Am-Oled Display Based on White Emitter with Microcavity Structure," SID Digest '04: SID International Symposium Digest of Technical Papers, vol. 35, 2004, pp. 1017-1019.

* cited by examiner

FIG. 4A
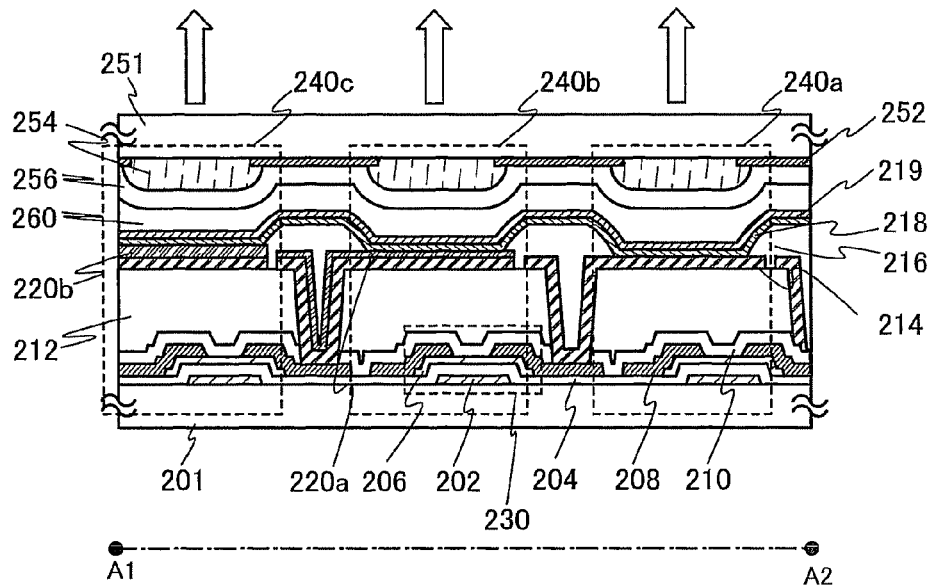
FIG. 4B
FIG. 4C
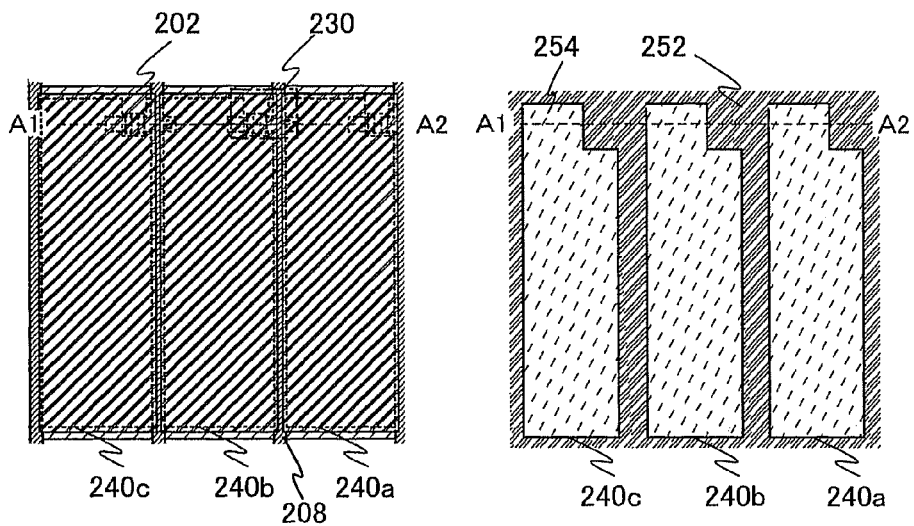

LIGHT-EMITTING DEVICE AND ELECTRONIC DEVICE USING LIGHT-EMITTING DEVICE

BACKGROUND OF THE INVENTION

1. Field of the Invention

One embodiment of the present invention relates to a light-emitting device using electroluminescence. Further, one embodiment of the present invention relates to an electronic device using the light-emitting device.

2. Description of the Related Art

In recent years, research and development have been actively conducted on light-emitting elements using electroluminescence (EL). In a basic structure of such a light-emitting element, a layer containing a substance with a light-emitting property is provided between a pair of electrodes. A voltage is applied to this element, so that light emission from the light-emitting substance can be obtained.

Since the above light-emitting element is a self-luminous type, and thus a light-emitting device using the light-emitting element has advantages such as high visibility, no necessity of a backlight, and low power consumption. In addition, such a light-emitting device also has advantages in that the device can be formed to be thin and lightweight and that response time is high.

For example, in the case where the light-emitting element is applied to an active matrix light-emitting device, the light-emitting element is formed over a substrate provided with a transistor for controlling light emission or the like in some cases. With such a structure (bottom-emission structure) where light emitted from a light-emitting element is extracted to outside through a substrate provided with a transistor for controlling light emission or the like, there is a problem of low aperture ratio due to a wiring, a transistor, or the like.

In order to solve that problem, a structure (top emission structure) where light is extracted from the side opposite to an element substrate has been proposed (e.g., see Patent Document 1). With the top-emission structure, the aperture ratio can be increased, and the extraction efficiency of light can be increased, which are advantageous in power consumption and high definition.

Further, in order to improve the extraction efficiency of light from a light-emitting element, a method in which a microcavity using a resonant effect of light between a pair of electrodes is used to increase the light intensity in a specific wavelength (e.g., see Patent Document 2), a structure in which a region where the cavity length is different is provided in each pixel to improve the viewing angle dependence of a light-emitting element (e.g., see Patent Document 3), and the like have been proposed.

REFERENCE

Patent Document 1: Japanese Published Patent Application No. 2001-043980
Patent Document 2: Japanese Published Patent Application No. H06-275381
Patent Document 3: Japanese Published Patent Application No. 2006-032327

However, in Patent Document 2 and Patent Document 3, in order to use a microcavity, it is necessary to adjust the thickness of a transparent conductive film or a transparent insulating layer provided between a pair of electrodes for each color of red (R), green (G), and blue (B). Thus, patterning, etching, or the like is needed depending on the color, resulting in an increase in the number of masks and the number of manufacturing steps; therefore, Patent Documents 2 and 3 are not optimum.

SUMMARY OF THE INVENTION

In view of the foregoing, one object of one embodiment of the present invention is to provide a light-emitting element in a light-emitting device, the light-emitting device, and an electronic device using the light-emitting device in which a light resonant effect between a pair of electrodes is used and an increase in the number of masks and an increase in the number of manufacturing steps are reduced to improve the color purity of light emitted from the light-emitting element with a simple structure.

One embodiment of the present invention is a light-emitting device including first to third light-emitting elements each including a reflection electrode layer, a transflective electrode layer, and a light-emitting layer provided between the reflection electrode layer and the transflective electrode layer. In the first light-emitting element, the light-emitting layer is in contact with the reflection electrode layer, and the transflective electrode layer is in contact with the light-emitting layer. In the second light-emitting element, a first transparent electrode layer is in contact with the reflection electrode layer, the light-emitting layer is in contact with the first transparent electrode layer, and the transflective electrode layer is in contact with the light-emitting layer. In the third light-emitting element, a second transparent electrode layer is in contact with the reflection electrode layer, the light-emitting layer is in contact with the second transparent electrode layer, and the transflective electrode layer is in contact with the light-emitting layer. The thickness of the first transparent electrode layer is different from that of the second transparent electrode layer.

One embodiment of the present invention is a light-emitting device including first to fourth light-emitting elements each including a reflection electrode layer, a transflective electrode layer, and a light-emitting layer provided between the reflection electrode layer and the transflective electrode layer. In the first light-emitting element, the light-emitting layer is in contact with the reflection electrode layer, and the transflective electrode layer is in contact with the light-emitting layer. In the second light-emitting element, a first transparent electrode layer is in contact with the reflection electrode layer, the light-emitting layer is in contact with the first transparent electrode layer, and the transflective electrode layer is in contact with the light-emitting layer. In the third light-emitting element, a second transparent electrode layer is in contact with the reflection electrode layer, the light-emitting layer is in contact with the second transparent electrode layer, and the transflective electrode layer is in contact with the light-emitting layer. In the fourth light-emitting element, a third transparent electrode layer is in contact with the reflection electrode layer, the light-emitting layer is in contact with the third transparent electrode layer, and the transflective electrode layer is in contact with the light-emitting layer. The thicknesses of the first to third transparent electrode layers are different from each other.

One embodiment of the present invention is a light-emitting device including first to third light-emitting elements each including a reflection electrode layer, a transflective electrode layer, and a light-emitting layer provided between the reflection electrode layer and the transflective electrode layer, and a coloring layer which is provided facing the transflective electrode layer and through which light in a specific wavelength range passes. In the first light-emitting element, the light-emitting layer is in contact with the reflection electrode layer, and the transflective electrode layer is in contact with the light-emitting layer. In the second light-emitting element, a first transparent electrode layer is in contact with the reflection electrode layer, the light-emitting layer is in contact with the first transparent electrode layer, and the transflective electrode layer is in contact with the light-emitting layer. In the third light-emitting element, a second transparent electrode layer is in contact with the reflection electrode layer, the light-emitting layer is in contact with the second transparent electrode layer, and the transflective electrode layer is in contact with the light-emitting layer. The thickness of the first transparent electrode layer is different from that of the second transparent electrode layer.

One embodiment of the present invention is a light-emitting device including first to fourth light-emitting elements each including a reflection electrode layer, a transflective electrode layer, and a light-emitting layer provided between the reflection electrode layer and the transflective electrode layer, and a coloring layer which is provided facing the transflective electrode layer and through which light in a specific wavelength range passes. In the first light-emitting element, the light-emitting layer is in contact with the reflection electrode layer, and the transflective electrode layer is in contact with the light-emitting layer. In the second light-emitting element, a first transparent electrode layer is in contact with the reflection electrode layer, the light-emitting layer is in contact with the first transparent electrode layer, and the transflective electrode layer is in contact with the light-emitting layer. In the third light-emitting element, a second transparent electrode layer is in contact with the reflection electrode layer, the light-emitting layer is in contact with the second transparent electrode layer, and the transflective electrode layer is in contact with the light-emitting layer. In the fourth light-emitting element, a third transparent electrode layer is in contact with the reflection electrode layer, the light-emitting layer is in contact with the third transparent electrode layer, and the transflective electrode layer is in contact with the light-emitting layer. The thicknesses of the first to third transparent electrode layers are different from each other.

In the above-described structure, the intensity of light emitted from the first light-emitting element may peak in the wavelength range of blue, that of light emitted from the second light-emitting element may peak in the wavelength range of green, that of light emitted from the third light-emitting element may peak in the wavelength range of red, and light emitted from the fourth light-emitting element may peak in the wavelength range of yellow.

In the above-described structure, the light-emitting layer may include a hole-injection layer, a hole-transport layer, an electron-transport layer, and an electron-injection layer. White light may be obtained from the light-emitting layer. The transflective electrode layer may be formed using a material containing indium oxide, silver, and/or magnesium.

Further, in the above-described structure, the hole-injection layer may contain molybdenum oxide.

In the above-described structure, light emitted from the light-emitting layer is extracted through the transflective electrode layer.

One embodiment of the present invention is an electronic device including the light-emitting device having the above-described structure.

In this specification and the like, the light-emitting device includes in its category an image display device, a light-emission device, a light source, a lighting device, and the like. The light-emitting device further includes a module in which a connector (FPC: flexible printed circuit) or the like is attached to a panel where a light-emitting element is formed.

Further, in this specification and the like, the light-emitting device refers to a structure in which a light-emitting layer is provided between a pair of electrodes (a refection electrode layer and a transflective electrode layer). Any functional layer, a transparent electrode layer, or the like may be further provided between the pair of electrodes.

In this specification and the like, the light-emitting device also refers to a structure in which a plurality of light-emitting elements is formed.

In addition, in this specification and the like, the term such as "electrode" or "wiring" does not limit a function of a component. For example, the "electrode" is sometimes used as part of the "wiring", and vice versa. Furthermore, the term "electrode" or "wiring" includes in its category a plurality of "electrodes" or "wirings" formed in an integrated manner.

Further, the functions of the "source" and the "drain" are sometimes interchanged with each other depending on, for example, the conductivity type of a transistor or the direction of current in a circuit operation. Therefore, the terms "source" and "drain" can be interchanged with each other in this specification.

According to one embodiment of the present invention, provided can be a light-emitting device in which a light resonant effect between a pair of electrodes is used but an increase in the number of masks and an increase in the number of manufacturing steps are reduced to improve the color purity of light emitted from a light-emitting element with a simple structure.

Further, according to one embodiment of the present invention, an electronic device including the light-emitting device can be provided.

BRIEF DESCRIPTION OF THE DRAWINGS

In the accompanying drawings:

FIGS. 4A to 4C are diagrams illustrating a light-emitting device;

DETAILED DESCRIPTION OF THE INVENTION

Figure 1A:
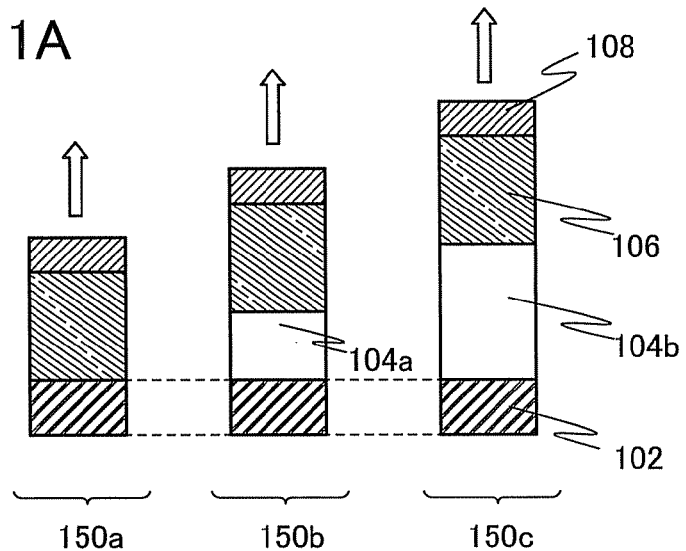
FIGS. 1A and 1B are diagrams illustrating light-emitting elements.

Hereinafter, embodiments of the present invention are described in detail using the drawings. Note that the present invention is not limited to the embodiments described below, and it is apparent to those skilled in the art that modes and details can be modified in various ways without departing from the spirit of the present invention disclosed in this specification and the like. Structure of the different embodiments can be implemented by appropriate combination. On the description of the present invention hereinbelow, a reference numeral indicating each part is used in common throughout the drawings, and description thereof is not repeated.

Note that the position, the size, the range, or the like of each structure illustrated in the drawings and the like is not accurately illustrated in some cases for easy understanding. Therefore, the present invention is not necessarily limited to the position, size, range, or the like disclosed in the drawings and the like.

Further, in this specification and the like, ordinal numbers such as "first", "second", and "third" are used in order to avoid confusion among components, and do not give any limitation of the number of components.

Embodiment 1

Figure 1B:
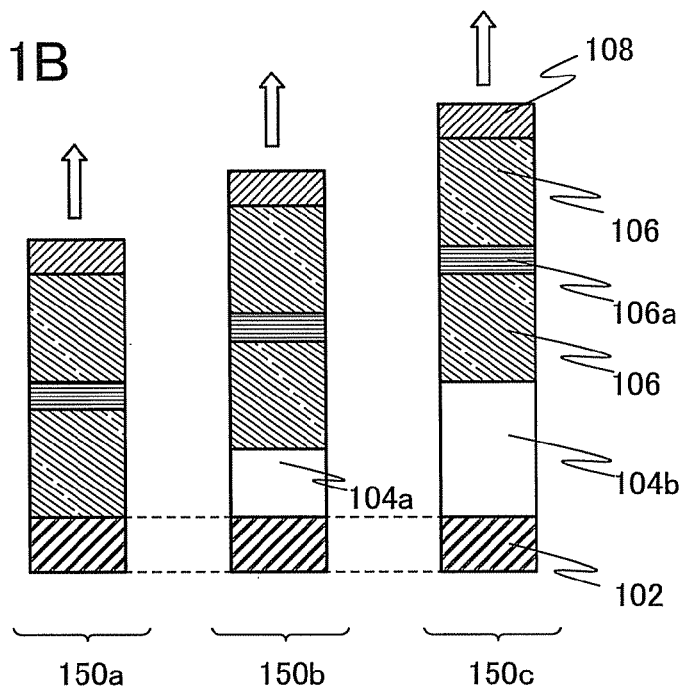

In Embodiment 1, one embodiment of a light-emitting device of the present invention is described using FIGS. 1A and 1B.

The light-emitting device shown in FIG. 1A is a cross-sectional diagram illustrating a concept of the present invention and includes a first light-emitting element 150a, a second light-emitting element 150b, and a third light-emitting element 150c. In the first light-emitting element 150a, a light-emitting layer 106 is provided in contact with a reflection electrode layer 102, and a transflective electrode layer 108 is provided in contact with the light-emitting layer 106. In the second light-emitting element 150b, a first transparent electrode layer 104a is provided in contact with the reflection electrode layer 102, the light-emitting layer 106 is provided in contact with the first transparent electrode layer 104a, and the transflective electrode layer 108 is provided in contact with the light-emitting layer 106. In the third light-emitting element 150c, a second transparent electrode layer 104b is provided in contact with the reflection electrode layer 102, the light-emitting layer 106 is provided in contact with the second transparent electrode layer 104b, and the transflective electrode layer 108 is provided in contact with the light-emitting layer 106. That is, the first to third light-emitting elements each including the reflection electrode layer, the transflective electrode layer, and the light-emitting layer provided between the reflection electrode layer and the transflective electrode layer are included in the light-emitting device. Further, as shown in FIG. 1A, the thickness of the first transparent electrode layer 104a is different from that of the second transparent electrode layer 104b.

In the above-described structure, the intensity of light emitted from the first light-emitting element 150a peaks in the wavelength range of blue, that of light emitted from the second light-emitting element 150b peaks in the wavelength range of green, and that of light emitted from the third light-emitting element 150c peaks in the wavelength range of red.

In this specification and the like, the wavelength range of blue is a wavelength range from 450 nm to 485 nm, the wavelength range of green is a wavelength range from 500 nm to 565 nm, and the wavelength range of red is a wavelength range from 600 nm to 740 nm.

The light-emitting device shown in FIG. 1A includes a plurality of light-emitting elements in each of which light emitted from the light-emitting layer 106 is reflected by the reflection electrode layer 102 and extracted from the transflective electrode layer 108 side. That is, the light-emitting device emits light in the direction indicated by an arrow in FIG. 1A. Further, light is emitted from the light-emitting layer 106 in all directions; thus, light emitted from the light-emitting layer 106 resonates by the reflection electrode layer 102 and the transflective electrode layer 108, whereby a function as a so-called microcavity is provided. With such a structure, a desired light-emission spectrum can be intensified, leading to an enhancement of the color purity of light from the light-emitting element.

The function as a microcavity can be adjusted by a material provided between the reflection electrode layer 102 and the transflective electrode layer 108, a light path length, and the like. For example, only the light-emitting layer 106 is provided between the layers in the first light-emitting element 150a, the first transparent electrode layer 104a and the light-emitting layer 106 are provided between the layers in the second light-emitting element 150b, and the second transparent electrode layer 104b and the light-emitting layer 106 are provided between the layers in the third light-emitting element 150c; that is, the light path length between the reflection electrode layer 102 and the transflective electrode layer 108, and the like are different per color (blue, green, red) of the light-emitting element. Further, the light path length can be adjusted by changing the thickness of the first transparent electrode layer 104a and/or the second transparent electrode layer 104b.

The optical distance (also called light path length) between the reflection electrode layer 102 and the transflective electrode layer 108 is changed depending on the color (blue, green, red). The optical distance is the product of physical distance and refractive index. In this specification and the like, the optical distance is the product of film thickness and n (refractive index), i.e., Optical Distance=Film Thickness× n. For example, for the adjustment of the optical distance, the following may be performed. The first light-emitting element 150a may be designed such that the distance between the reflection electrode layer 102 and the transflective electrode layer 108 is $(2N_a-1)/4$ times ($N_a$ is a natural number) of a given wavelength of light. The second light-emitting element 150b may be designed such that the distance between the reflection electrode layer 102 and the transflective electrode layer 108 is $(2N_b-1)/4$ times ($N_b$ is a natural number) of a given wavelength of light; that is, the distance between the reflection electrode layer 102 and the transflective electrode layer 108 can be adjusted by adjusting the thickness of the first transparent electrode layer 104a. The third light-emitting element 150c may be designed such that the distance between the reflection electrode layer 102 and the transflective electrode layer 108 is $(2N_c-1)/4$ times ($N_c$ is a natural number) of a given wavelength of light; that is, the distance between the reflection electrode layer 102 and the transflective electrode layer 108 can be adjusted by adjusting the thickness of the second transparent electrode layer 104b. In this manner, the light path length may be determined so as to amplify a spectrum corresponding to the color (blue, green, or red) by a resonance effect. Further, neither the first transparent electrode layer nor the second transparent electrode layer is provided only in the first light-emitting element 150a; that is, only the light-emitting layer 106 is provided between the reflection electrode layer 102 and the transflective electrode layer 108 in the first light-emitting element 150a.

With the structure, the number of masks, the number of manufacturing steps, and manufacturing costs can be reduced because the transparent electrode layer is not needed in the first light-emitting element 150a.

Here, a region where the light-emitting layer 106 is in contact with the reflection electrode layer 102 (the region corresponds to a so-called hole-injection layer) is preferably formed using a composite material of an organic compound and an acceptor. A transition metal oxide, vanadium oxide, molybdenum oxide, or the like can be used as the acceptor. Molybdenum oxide is preferable due to its stability in the air and high sublimation properties. In the first light-emitting element 150a, holes are generally less likely to be injected because no transparent electrode layer is provided between the reflection electrode layer 102 and the light-emitting layer 106; however, the hole-injection properties are improved by employing the structure, which makes it possible to provide no transparent electrode layer in the first light-emitting element 150a, leading to reductions in the number of masks, the number of manufacturing steps, and manufacturing costs.

Next, a light-emitting device shown in FIG. 1B is described below.

The light-emitting device shown in FIG. 1B is a modified embodiment of the light-emitting device shown in FIG. 1A. The basic concept is the same as that of FIG. 1A in that the optical distance between the reflection electrode layer 102 and the transflective electrode layer 108 is adjusted so that a microcavity is used to intensify a desired spectrum in each light-emitting element for emitting light of a color (blue, green, red). Therefore, the same portions or portions having a similar function are denoted by the same reference numerals, and description thereof is not repeated.

The light-emitting device shown in FIG. 1B is a cross-sectional diagram illustrating a concept of the present invention and includes a first light-emitting element 150a, a second light-emitting element 150b, and a third light-emitting element 150c. The light-emitting device shown in FIG. 1B is different from the light-emitting device shown in FIG. 1A in that the number of light-emitting layers 106 is two and a charge generation layer 106a is provided between the light-emitting layers 106.

The charge generation layer 106a is excellent in carrier-injection properties and carrier-transport properties, and thus enables a light-emitting element to be driven at low current at low voltage.

As described above, either such a light-emitting layer having the single-layer structure shown in FIG. 1A or such a light-emitting layer having the stacked-layer structure shown in FIG. 1B may be used as the light-emitting layer 106. Although two light-emitting layers are stacked in the stacked-layer structure in FIG. 1B, one embodiment of the present invention is not limited thereto; three or more light-emitting layers may be stacked.

Materials and the like which can be used in the light-emitting devices shown in FIGS. 1A and 1B are described below.

The reflection electrode layer 102 can be formed using a metal film having high reflectance. The metal film having high reflectance can be formed using a single layer or a stacked layer using aluminum, silver, an alloy containing such a metal material, or the like. A thin metal film (preferably with a thickness of 20 nm or less, further preferably 10 nm or less) may be further stacked on the metal film having high reflectance. For example, it is preferable to form a thin titanium film by which formation of an insulating film between the light-emitting layer 106 and the metal film having high reflectance (aluminum, an alloy containing aluminum, silver, or the like) can be suppressed. The thin metal film may be oxidized; in that case, a material which is unlikely to be insulated by oxidation, such as titanium or molybdenum, is preferably used.

Any of the first transparent electrode layer 104a and the second transparent electrode layer 104b can be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of those metal oxide materials in which silicon oxide is contained can be used.

The light-emitting layer 106 includes at least a light-emitting layer, and may also include a functional layer other than the light-emitting layer. The light-emitting layer 106 is preferably formed using a material which emits white light.

The charge generation layer 106a can be formed using a composite material of an organic compound and a metal oxide, a metal oxide, a composite material of an organic compound and an alkali metal, an alkaline earth metal, or a compound thereof, or an appropriate combination of those materials.

The transflective electrode layer 108 can be formed by stacking a thin metal film (preferably with a thickness of 20 nm or less, further preferably 10 nm or less) and a conductive metal oxide film. The thin metal film can be formed using a single layer or a stacked layer using silver, magnesium, an alloy containing such a metal material, or the like. As the conductive metal oxide, indium oxide ($In_2O_3$), tin oxide ($SnO_2$), zinc oxide (ZnO), ITO, an indium oxide-zinc oxide alloy ($In_2O_3$—ZnO), or any of those metal oxide materials in which silicon oxide is contained can be used.

In this embodiment, the reflection electrode layer 102 functions as an anode and the transflective electrode layer 108 functions as a cathode in the first light-emitting element 150a. The reflection electrode layer 102 and the first transparent electrode layer 104a function as an anode and the transflective electrode layer 108 functions as a cathode in the second light-emitting element 150b. The reflection electrode layer 102 and the second transparent electrode layer 104b function as an anode and the transflective electrode layer 108 functions as a cathode in the third light-emitting element 150c.

As described above, the optical distance is changed between the first to third light-emitting elements in the light-emitting device described in this embodiment. A desired spectrum is intensified by a microcavity in each light-emitting element, whereby the light-emitting device can have high color purity. Further, the transparent electrode layer is not provided only in the first light-emitting element, by which the number of masks, the number of manufacturing steps, and manufacturing costs can be reduced.

This embodiment can be implemented in appropriate combination with any structure described in the other embodiments.

Embodiment 2

Figure 2A:
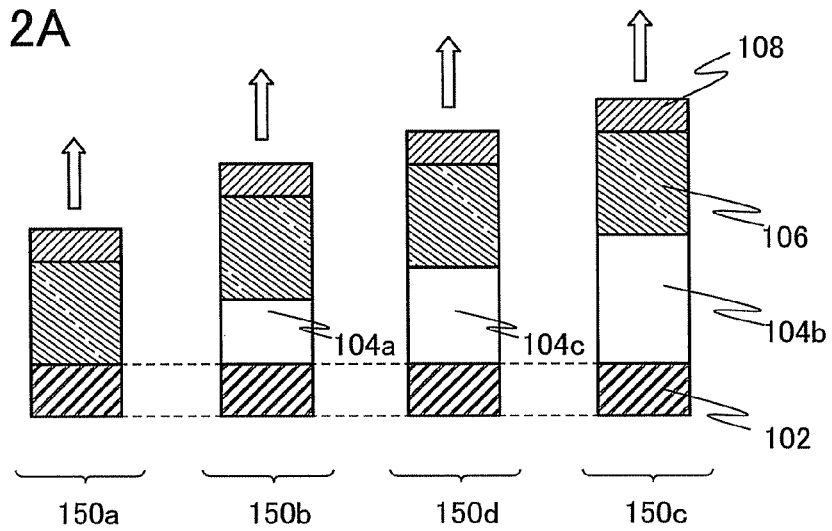
FIGS. 2A and 2B are diagrams illustrating light-emitting elements.
Figure 2B:
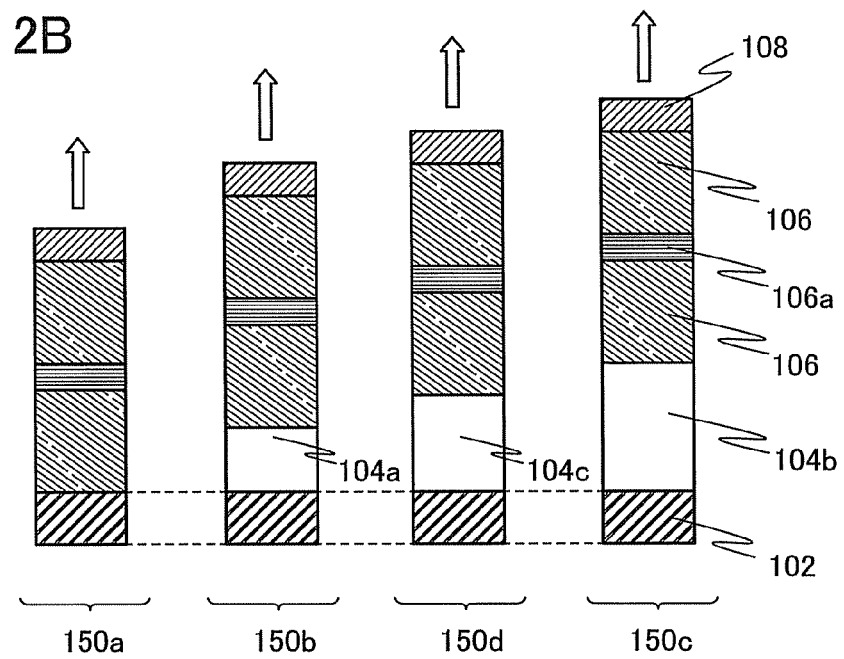

In this embodiment, structures of one embodiment of a light-emitting device of the present invention, which are different from Embodiment 1, are described using FIGS. 2A and 2B.

A light-emitting device shown in FIG. 2A is a cross-sectional diagram illustrating a concept of the present invention and includes a first light-emitting element 150a, a second light-emitting element 150b, a third light-emitting element 150c, and a fourth light-emitting element 150d. In the first light-emitting element 150a, a light-emitting layer 106 is provided in contact with a reflection electrode layer 102, and a transflective electrode layer 108 is provided in contact with the light-emitting layer 106. In the second light-emitting element 150b, a first transparent electrode layer 104a is provided in contact with the reflection electrode layer 102, the light-emitting layer 106 is provided in contact with the first transparent electrode layer 104a, and the transflective electrode layer 108 is provided in contact with the light-emitting layer 106. In the third light-emitting element 150c, a second transparent electrode layer 104b is provided in contact with the reflection electrode layer 102, the light-emitting layer 106 is provided in contact with the second transparent electrode layer 104b, and the transflective electrode layer 108 is provided in contact with the light-emitting layer 106. In the fourth light-emitting element 150d, a third transparent electrode layer 104c is provided in contact with the reflection electrode layer 102, the light-emitting layer 106 is provided in contact with the third transparent electrode layer 104c, and the transflective electrode layer 108 is provided in contact with the light-emitting layer 106. That is, the first to fourth light-emitting elements each including the reflection electrode layer, the transflective electrode layer, and the light-emitting layer provided between the reflection electrode layer and the transflective electrode layer are included in the light-emitting device. Further, as shown in FIG. 2A, the thickness is different between the first transparent electrode layer 104a, the second transparent electrode layer 104b, and the third transparent electrode layer 104c.

The intensity of light emitted from the first light-emitting element 150a peaks in the wavelength range of blue, that of light emitted from the second light-emitting element 150b peaks in the wavelength range of green, that of light emitted from the third light-emitting element 150c peaks in the wavelength range of red, and that of light emitted from the fourth light-emitting element 150d peaks in the wavelength range of yellow.

In this specification and the like, the wavelength range of blue is a wavelength range from 450 nm to 485 nm, the wavelength range of green is a wavelength range from 500 nm to 565 nm, the wavelength range of yellow is a wavelength range from 570 nm to 590 nm, and the wavelength range of red is a wavelength range from 600 nm to 740 nm.

The light-emitting device shown in FIG. 2A and a light-emitting device shown in FIG. 2B are modified embodiments of Embodiment 1. The light-emitting device described in this embodiment exhibits light of four colors (RGBY) whereas the light-emitting device described in Embodiment 1 exhibits light of three colors (RGB). The basic concept of this embodiment is the same as that of Embodiment 1 in that the optical distance between the reflection electrode layer 102 and the transflective electrode layer 108 is adjusted so that a microcavity is used to intensify a desired spectrum in each light-emitting element for emitting light of a color (the first light-emitting element 150a, the second light-emitting element 150b, the third light-emitting element 150c, the fourth light-emitting element 150d). Therefore, the same portions or portions having a similar function are denoted by the same reference numerals, and description thereof is not repeated.

The light-emitting device shown in FIG. 2A includes a plurality of light-emitting elements in each of which light emitted from the light-emitting layer 106 is reflected by the reflection electrode layer 102 and extracted from the transflective electrode layer 108 side. That is, the light-emitting device emits light in the direction indicated by an arrow in FIG. 2A. Further, light is emitted from the light-emitting layer 106 in all directions; thus, light emitted from the light-emitting layer 106 resonates by the reflection electrode layer 102 and the transflective electrode layer 108, whereby a function as a so-called microcavity can be provided. With such a structure, a desired light-emission spectrum can be intensified, leading to an enhancement of the color purity of light from the light-emitting element.

The function as a microcavity can be adjusted by a material provided between the reflection electrode layer 102 and the transflective electrode layer 108, a light path length, and the like. For example, only the light-emitting layer 106 is provided between the layers in the first light-emitting element 150a, the first transparent electrode layer 104a and the light-emitting layer 106 are provided between the layers in the second light-emitting element 150b, the second transparent electrode layer 104b and the light-emitting layer 106 are provided between the layers in the third light-emitting element 150c, and the third transparent electrode layer 104c and the light-emitting layer 106 are provided between the layers in the fourth light-emitting element 150d; the light path length between the reflection electrode layer 102 and the transflective electrode layer 108 are different per color (blue, green, red, yellow) of the light-emitting element. Further, the light path length can also be adjusted by changing the thickness of the first transparent electrode layer 104a, the second transparent electrode layer 104b, and the third transparent electrode layer 104c.

In this manner, the light path length between the reflection electrode layer 102 and the transflective electrode layer 108 is changed depending on the color (blue, green, red, yellow) to change the optical distance. The optical distance may be adjusted to the light path length so as to amplify a spectrum corresponding to the color (blue, green, red, or yellow) by a resonance effect. Further, none of the first transparent electrode layer, the second transparent electrode layer, and the third transparent electrode layer is provided in the first light-emitting element 150a; that is, only the light-emitting layer 106 is provided between the reflection electrode layer 102 and the transflective electrode layer 108.

With the structure, the number of masks, the number of manufacturing steps, and manufacturing costs can be reduced because the transparent electrode layer is not needed in the first light-emitting element 150a.

Next, the light-emitting device shown in FIG. 2B is described below.

The light-emitting device shown in FIG. 2B is a modified embodiment of the light-emitting device shown in FIG. 2A. The basic concept is the same as that of FIG. 2A in that the optical distance between the reflection electrode layer 102 and the transflective electrode layer 108 is adjusted so that a microcavity is used to intensify a desired spectrum in each light-emitting element for emitting light of a color (blue, green, red, yellow). Therefore, the same portions or portions having a similar function are denoted by the same reference numerals, and description thereof is not repeated.

The light-emitting device shown in FIG. 2B is a cross-sectional diagram illustrating a concept of the present invention and includes a first light-emitting element 150a, a second light-emitting element 150b, a third light-emitting element 150c, and a fourth light-emitting element 150d. The light-emitting device shown in FIG. 2B is different from the light-emitting device shown in FIG. 2A in that the number of light-emitting layers 106 is two and a charge generation layer 106a is provided between the light-emitting layers 106.

As described above, either such a light-emitting layer having a single-layer structure shown in FIG. 2A or such a light-emitting layer having a stacked-layer structure shown in FIG. 2B may be used as the light-emitting layer 106. Although two light-emitting layers are stacked in the stacked-layer structure in FIG. 2B, one embodiment of the present invention is not limited thereto; three or more light-emitting layers may be stacked.

As described above, the optical distance is changed between the first to fourth light-emitting elements in the light-emitting device described in this embodiment. A desired spectrum is intensified by a microcavity in each light-emitting element in the light-emitting device, whereby the light-emitting device can have high color purity. Further, the transparent electrode layer is not provided in the first light-emitting element, by which the number of masks, the number of manufacturing steps, and manufacturing costs can be reduced.

This embodiment can be implemented in appropriate combination with any structure described in the other embodiments.

Embodiment 3

Figure 3A:
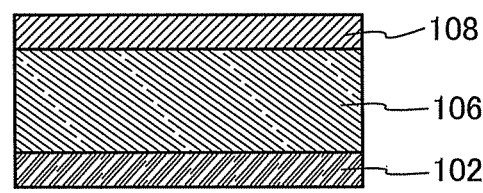
FIGS. 3A and 3B are diagrams illustrating light-emitting elements.
Figure 3B:
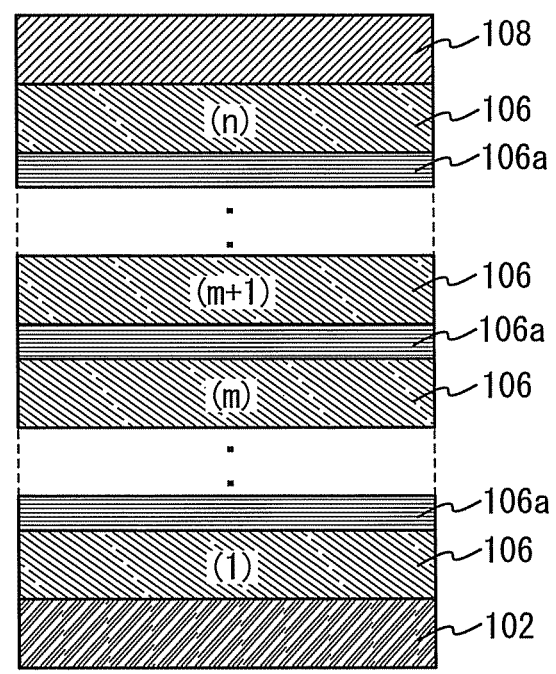

In this embodiment, details about the light-emitting element including the refection electrode layer 102, the light-emitting layer 106, and the transflective electrode layer 108 described in Embodiment 1 and Embodiment 2 are described using FIGS. 3A and 3B.

A light-emitting element shown in FIG. 3A has a structure in which the light-emitting layer 106 including an emitting region is provided between a pair of electrodes (the refection electrode layer 102 and the transflective electrode layer 108). In this embodiment, the refection electrode layer 102 is used as an anode and the transflective electrode layer 108 is used as a cathode as an example.

The light-emitting layer 106 includes at least a light-emitting layer and may include any functional layer in addition to the light-emitting layer. Examples of the functional layer other than the light-emitting layer include a layer containing a substance having high hole-injection properties, a substance having high hole-transport properties, a substance having high electron-transport properties, a substance having high electron-injection properties, a bipolar substance (a substance having high electron- and hole-transport properties), or the like. Specifically, functional layers such as a hole-injection layer, a hole-transport layer, an electron-transport layer, and an electron-injection layer can be used in combination as appropriate.

The light-emitting element shown in FIG. 3A emits light when current flows by a potential difference between the refection electrode layer 102 and the transflective electrode layer 108 to recombine holes and electrons in the light-emitting layer 106. That is, an emitting region is formed in the light-emitting layer 106.

In the present invention, light is extracted from the transflective electrode layer 108 side to outside. Therefore, the transflective electrode layer 108 is formed using a light-transmitting material. Further, in order to use a microcavity effect, the transflective electrode layer 108 is preferably formed using a material which reflects part of light to the refection electrode layer 102 side. Further, in order to extract light from the transflective electrode layer 108 side to outside efficiently, the refection electrode layer 102 is preferably formed using a material having high reflectance.

A plurality of light-emitting layers 106 may be stacked between the refection electrode layer 102 and the transflective electrode layer 108 as shown in FIG. 3B. In the case where n (n is a natural number of greater than or equal to 2) layers are stacked, each of the charge generation layers 106a is preferably provided between the m-th (m is a natural number of greater than or equal to 1 and less than or equal to n−1) light-emitting layer and the (m+1)th light-emitting layer.

The charge generation layer 106a can be formed using a composite material of an organic compound and a metal oxide, a metal oxide, a composite material of an organic compound and alkali metal, alkaline earth metal, or a compound thereof, or a combination thereof. The composite material of an organic compound and a metal oxide includes an organic compound and a metal oxide such as vanadium oxide, molybdenum oxide, or tungsten oxide, for example. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use an organic compound which has hole-transport properties and has a hole mobility of $10^{-6}$ cm$^2$/Vs or higher. However, any other substance may also be used as long as the substance has higher hole-transport properties than electron-transport properties. These materials used for the charge generation layer 106a are excellent in carrier-injection properties and carrier-transport properties, so that the light-emitting element can be driven at low current at low voltage.

The charge generation layer 106a may be formed by combination of a composite material of an organic compound and a metal oxide with another material. For example, a layer containing a composite material of an organic compound and a metal oxide may be combined with a layer containing a compound selected from substances with electron-donating properties and a compound with high electron-transport properties. A layer containing a composite material of an organic compound and a metal oxide may also be combined with a transparent conductive film.

With such a structure, problems such as energy transfer and quenching less occur, and the range of choices of materials of a light-emitting element is widened, which easily enables both high light emission efficiency and long lifetime to be provided for the light-emitting element. Further, such a structure makes it easy to emit phosphorescence from one of light-emitting layers and fluorescence from the other of the light-emitting layers.

The charge generation layer 106a has a function of injecting holes to one of the light-emitting layers 106 which is in contact with the charge generation layer 106a and a function of injecting electrons to the other of the light-emitting layers 106, when a voltage is applied between the refection electrode layer 102 and the transflective electrode layer 108.

Light emission of a variety of colors can be obtained by varying the kind of light-emitting substance used in the light-emitting layers 106 in the structure shown in FIG. 3B. In addition, a plurality of light-emitting substances of different colors as the light-emitting substances brings emission having a broad spectrum or white light emission.

Further, the light path length between the reflection electrode layer 102 and the transflective electrode layer 108 may be adjusted by providing a transparent electrode layer between the reflection electrode layer 102 and the light-emitting layer 106. A desired spectrum can be intensified by adjusting the light path length.

In the case of obtaining white light emission using the light-emitting element shown in FIG. 3B, as for the combination of a plurality of light-emitting layers, a structure for emitting white light including red light, green light, and blue light may be employed. For example, a structure including a first light-emitting layer containing a blue fluorescent material as a light-emitting substance and a second light-emitting layer containing red and green phosphorescent materials as light-emitting substances may be employed. Alternatively, a structure including a first light-emitting layer exhibiting red light, a second light-emitting layer exhibiting green light, and a third light-emitting layer exhibiting blue light may be employed. Also with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combination of colors are as follows: blue and yellow, blue-green and red, and the like.

In the structure of the above-described stacked-layer element, by providing the charge generation layer between the stacked light-emitting layers, the element can have long lifetime in a high-luminance region while keeping the current density low. In addition, the voltage drop due to resistance of the electrode material can be suppressed, leading to uniform emission in a large area.

This embodiment can be implemented in appropriate combination with any structure described in the other embodiments.

Embodiment 4

In this embodiment, one embodiment of a light-emitting device of the present invention is described using FIGS. 4A to 4C.

FIGS. 4A to 4C are a cross-sectional diagram and plane views corresponding to part of pixels of a light-emitting device.

The light-emitting device shown in FIG. 4A emits light in a direction indicated by an arrow in FIG. 4A. That is, the light-emitting device has a so-called top-emission structure in which light is extracted not through a first substrate 201 provided with a light-emitting layer 218, but through a second substrate 251.

FIG. 4B is the plane view of the first substrate 201 seen from a transflective electrode layer 219 side; FIG. 4C is the plane view of the second substrate 251 seen from a light-shielding film 252 side. FIG. 4A corresponds to the cross-sectional diagram cut along dotted line A1-A2 in FIGS. 4B and 4C. In the plan views in FIGS. 4B and 4C, some components (for example, the light-emitting layer 218) of the present invention are omitted in order to avoid complexity.

As shown in FIG. 4A, a blue pixel 240a, a green pixel 240b, and a red pixel 240c are provided between the first substrate 201 and the second substrate 251. Further, over the first substrate 201, a transistor 230 for controlling the driving of the light-emitting element and a reflection electrode layer 214 which is electrically connected to the transistor 230 are provided.

In this embodiment, the blue pixel 240a includes the light-emitting element whose emission peaks in the wavelength range of blue, the green pixel 240b includes the light-emitting element whose emission peaks in the wavelength range of green, and the red pixel 240c includes the light-emitting element whose emission peaks in the wavelength range of red.

In the blue pixel 240a, the light-emitting layer 218 is directly formed on the reflection electrode layer 214 and the transflective electrode layer 219 is formed over the light-emitting layer 218 in the light-emitting element for blue.

In the green pixel 240b, a first transparent electrode layer 220a is formed over the reflection electrode layer 214, the light-emitting layer 218 is formed over the first transparent electrode layer 220a, and the transflective electrode layer 219 is formed over the light-emitting layer 218 in the light-emitting element for green.

In the red pixel 240c, a second transparent electrode layer 220b is formed over the reflection electrode layer 214, the light-emitting layer 218 is formed over the second transparent electrode layer 220b, and the transflective electrode layer 219 is formed over the light-emitting layer 218 in the light-emitting element for red.

In this manner, the structure between the reflection electrode layer 214 and the transflective electrode layer 219 in the light-emitting element is different per pixel (the blue pixel 240a, the green pixel 240b, the red pixel 240c).

The second substrate 251 is provided with the light-shielding film 252 which functions as a black matrix, a color filter 254, and an overcoat 256. The color filter 254 is a coloring layer, through which light corresponding to the color (blue, green, or red) of light emitted from the light-emitting layer 218 passes to be extracted from the second substrate 251 side.

In this manner, the light path length between the reflection electrode layer 214 and the transflective electrode layer 219 is changed in the light-emitting element depending on the pixel (the blue pixel 240a, the green pixel 240b, the red pixel 240c) to change the optical distance. The optical distance may be adjusted to the light path length so as to amplify a spectrum for the light-emitting element in the pixel by a resonance effect. The light-emitting layer 218 is directly formed on the reflection electrode layer 214, and the transflective electrode layer 219 is formed over the light-emitting layer 218 in the light-emitting element in the blue pixel 240a, i.e., a transparent electrode layer (the first transparent electrode layer 220a, the second transparent electrode layer 220b) is not formed in the light-emitting element in the blue pixel 240a.

With the structure, the number of masks, the number of manufacturing steps, and manufacturing costs can be reduced because the transparent electrode layer is not needed in the blue pixel 240a.

There is no particular limitation on a space 260 between the first substrate 201 and the second substrate 251 as long as the space 260 has a light-transmitting property. It is preferable that the space 260 be filled with a light-transmitting material the refractive index of which is higher than the air. In the case where the refractive index of the space 260 is low, light emitted from the light-emitting layer 218 in an oblique direction is further refracted by the space 260, and light is leaked from an adjacent pixel in some cases. Thus, for example, the space 260 can be filled with a light-transmitting adhesive having high refractive index and capable of bonding the first substrate 201 and the second substrate 251. Further, an inert gas or the like such as nitrogen or argon can be used.

Next, a detailed description of the light-emitting device shown in FIGS. 4A to 4C and a manufacturing method thereof are described.

First, a manufacturing method of the first substrate 201 provided with the transistor 230 for controlling the driving of a light-emitting element, the light-emitting layer 218, and the like is described below.

A conductive layer is formed over the first substrate 201 having an insulating surface, and then, a first photolithography step is performed thereon, so that a resist mask is formed, and then, an unnecessary portion of the conductive layer is removed by etching; in this manner, a gate electrode layer 202 is formed. Etching is preferably performed so that an end portion of the gate electrode layer 202 is tapered as shown in FIG. 4A, in order to improve coverage with a film stacked thereover.

There is no particular limitation on a substrate which can be used as the first substrate 201; however, it needs to have at least heat resistance to withstand heat treatment performed later. A glass substrate can be used as the first substrate 201.

Further, when the temperature of heat treatment performed later is high, a substrate having a strain point of 730° C. or higher is preferably used as the glass substrate. As a glass substrate, a glass material such as aluminosilicate glass, aluminoborosilicate glass, or barium borosilicate glass is used, for example. By containing a larger amount of barium oxide (BaO) than boron oxide, a glass substrate is heat-resistant and of more practical use. Therefore, a glass substrate containing BaO and $B_2O_3$ so that the amount of BaO is larger than that of $B_2O_3$ is preferably used.

Instead of the above-described glass substrate, a substrate formed of an insulator such as a ceramic substrate, a quartz substrate, or a sapphire substrate may be used. Alternatively, crystallized glass or the like may be used. The light-emitting device in this embodiment has a top-emission structure in which light is extracted through the second substrate 251; therefore, a non-light-transmitting substrate such as a metal substrate or the like can be used as the first substrate 201.

An insulating film serving as a base film may be provided between the first substrate 201 and the gate electrode layer 202. The base film functions to prevent diffusion of an impurity element from the first substrate 201 and can be formed using one film or stacked films selected from a silicon nitride film, a silicon oxide film, a silicon nitride oxide film, and a silicon oxynitride film.

The gate electrode layer 202 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

Next, a gate insulating layer 204 is formed over the gate electrode layer 202. The gate insulating layer 204 can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. For example, a silicon oxynitride film may be formed by a plasma CVD method using $SiH_4$ and $N_2O$ as a deposition gas.

Next, a semiconductor layer is formed, and a second photolithography step and an etching step are performed thereon, so that an island-shape semiconductor layer 206 is formed.

The semiconductor layer 206 can be formed using a silicon semiconductor or an oxide semiconductor. As the silicon semiconductor, single crystal silicon, polycrystalline silicon, or the like can be used as appropriate. As the oxide semiconductor, an In—Ga—Zn—O-based metal oxide or the like can be used as appropriate. As the semiconductor layer 206, an In—Ga—Zn—O-based metal oxide which is an oxide semiconductor is preferably used to reduce the off-state current of the semiconductor layer, whereby an off-state leakage current of a light-emitting element using the semiconductor layer can be reduced.

Next, a conductive film is formed over the gate insulating layer 204 and the semiconductor layer 206, and a third photolithography step and an etching step are performed thereon, so that a source and drain electrode layers 208 are formed.

As the conductive film for the source and drain electrode layers 208, for example, a metal film including an element selected from Al, Cr, Cu, Ta, Ti, Mo, and W, or a metal nitride film including any of the above elements as its component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, or a tungsten nitride film) may be stacked on one or both of a lower side and an upper side of a metal film of Al, Cu, or the like. The conductive film for the source and drain electrode layers 208 may also be formed using conductive metal oxide. As the conductive metal oxide, indium oxide ($In_2O_3$), tin oxide ($SnO_2$), zinc oxide (ZnO), ITO, an indium oxide-zinc oxide alloy ($In_2O_3$—ZnO), or any of these metal oxide materials in which silicon oxide is contained can be used.

Next, an insulating layer 210 is formed over the semiconductor layer 206 and the source and drain electrode layers 208. As the insulating layer 210, an inorganic insulating film such as a silicon oxide film, a silicon oxynitride film, or the like can be used.

Next, a second insulating layer 212 is formed over the insulating layer 210.

As the second insulating layer 212, an insulating film with a planarization function is preferably selected in order to reduce surface unevenness due to the transistor. For example, an organic material such as polyimide, acrylic, benzocyclobutene, or the like can be used. Other than such an organic material, it is also possible to use a low-dielectric constant material (a low-k material) or the like. The second insulating layer 212 may be formed by stacking a plurality of insulating films formed using any of these materials.

Next, a fourth photolithography step and an etching step are performed thereon to form openings which reach the source and drain electrode layers 208 in the second insulating layer 212 and the insulating layer 210. As a method for forming the openings, a dry-etching method, a wet-etching method, or the like may be selected as appropriate.

Next, a conductive film is formed over the second insulating layer 212 and the source and drain electrode layers 208, and then, a fifth photolithography step and an etching step are performed thereon, so that the refection electrode layer 214 is formed.

As the refection electrode layer 214, a material which reflects light emitted from the light-emitting layer 218 (formed later) efficiently is preferable. This is because the light-extraction efficiency can be improved. The refection electrode layer 214 may have a stacked-layer structure. For example, a conductive film of metal oxide, a titanium film, or the like may be formed thin on the side which is in contact with the light-emitting layer 218, and a metal film (aluminum, an alloy of aluminum, silver, or the like) which has high reflectance may be formed on the other side. With such a structure, formation of an insulating film between the light-emitting layer 218 and the metal film (aluminum, an alloy of aluminum, silver, or the like) which has high reflectance can be suppressed, which is preferable.

Next, a transparent conducive film is formed over the refection electrode layer 214, and a sixth photolithography step and an etching step are performed thereon, so that the first transparent electrode layer 220a is formed.

Next, a transparent conducive film is formed over the refection electrode layer 214 and the first transparent electrode layer 220a, and a seventh photolithography step and an etching step are performed thereon, so that the second transparent electrode layer 220b is formed. Neither the first transparent electrode layer 220a nor the second transparent electrode layer 220b is provided only in the blue pixel 240a.

As any of materials of the first transparent electrode layer 220a and the second transparent electrode layer 220b, indium oxide ($In_2O_3$), tin oxide ($SnO_2$), zinc oxide (ZnO), ITO, an indium oxide-zinc oxide alloy ($In_2O_3$—ZnO), or any of these metal oxide materials in which silicon oxide is contained can be used.

Methods of forming the first transparent electrode layer 220a and the second transparent electrode layer 220b are not limited thereto. For example, the following method can be used: a transparent conductive film is formed with a thickness required as the thickness of the second transparent electrode layer 220b, and is removed only in a region where the first transparent electrode layer 220a is to be formed by dry-etching or wet-etching to a thickness required as the thickness of the first transparent electrode layer 220a. The second transparent electrode layer 220b may be stacked on the transparent conductive film used in the first transparent electrode layer 220a.

With such a structure in which the transparent electrode layer is not provided only in the blue pixel 240a, the number of masks and the number of manufacturing steps can be reduced, leading to a reduction in manufacturing costs.

Next, a bank 216 is formed over the refection electrode layer 214, the first transparent electrode layer 220a, and the second transparent electrode layer 220b.

The bank 216 is formed using an organic insulating material or an inorganic insulating material. It is particularly preferable that the bank 216 be formed using a photosensitive resin material to have an opening over the refection electrode layer 214 in the blue pixel 240a so that a sidewall of the opening has an inclined surface with continuous curvature, an opening over the first transparent electrode layer 220a in the green pixel 240b so that a sidewall of the opening has an inclined surface with continuous curvature, and an opening over the second transparent electrode layer 220b in the red pixel 240c so that a sidewall of the opening has an inclined surface with continuous curvature.

Next, the light-emitting layer 218 is formed over the refection electrode layer 214, the first transparent electrode layer 220a, the second transparent electrode layer 220b, and the bank 216. The light-emitting layer 218 may have a single-layer or stacked-layer structure, and light emitted from the light-emitting layer 218 is preferably white, and has preferably peaks in each of red, green, and blue wavelength regions.

Next, the transflective electrode layer 219 is formed over the light-emitting layer 218.

One of the refection electrode layer 214 and the transflective electrode layer 219 functions as an anode of the light-emitting layer 218, and the other thereof functions as a cathode of the light-emitting layer 218. It is preferable to use a substance having a high work function for the electrode which functions as the anode, and a substance having a low work function for the electrode which functions as the cathode.

Through the above process, the first substrate 201 provided with the transistor 230 for controlling the driving of a light-emitting element and the light-emitting layer 218 is formed.

Next, a manufacturing method of the second substrate 251 provided with the light-shielding film 252, the color filters 254, and the overcoat 256 is described below.

First, a conductive film is formed over the second substrate 251, and an eighth photolithography step and an etching step are performed thereon, so that the light-shielding film 252 is formed. Color mixture between the pixels can be prevented by the light-shielding film 252. The light-shielding film 252 is not necessarily provided.

As the light-shielding film 252, a metal film having a low reflectance, such as titanium or chromium, an organic resin film which is impregnated with black pigment or black dye, or the like can be used.

Next, the color filters 254 are formed over the second substrate 251 and the light-shielding film 252.

The color filter 254 is a coloring layer through which light in a specific wavelength range passes. For example, a red (R) color filter through which light in the wavelength range of red passes, a green (G) color filter through which light in the wavelength range of green passes, a blue (B) color filter through which light in the wavelength range of blue passes, or the like can be used. Each color filter is formed in a desired position with a known material by a printing method, an inkjet method, an etching method using a photolithography technique, or the like.

Although a method using three colors of RGB is described in this embodiment, four colors of RGBY (Y is yellow) as described in Embodiment 2, or five or more colors may alternatively be employed in one embodiment of the present invention.

Next, the overcoat 256 is formed over the light-shielding film 252 and the color filters 254. The overcoat 256 can be formed using an organic resin film of acrylic, polyimide, or the like. With the overcoat 256, diffusion of impurities in the color filters 254 into the light-emitting layer 218 side can be prevented. The overcoat 256 can have a stacked-layer structure of an organic resin film and an inorganic resin film. As the inorganic resin film, silicon nitride, silicon oxide, or the like can be used. The overcoat 256 is not necessarily provided.

Through the above process, the second substrate 251 provided with the light-shielding film 252, the color filters 254, and the overcoat 256 is formed.

The first substrate 201 and the second substrate 251 are aligned to be attached to each other, whereby the light-emitting device is formed. Accordingly, the color filters 254, each of which is a coloring layer through which light in a specific wavelength range passes, are provided facing the transflective electrode layer 219 provided on the first substrate 201. The first substrate 201 can be attached to the second substrate 251 by using a light-transmitting adhesive having high refractive index, or the like.

As described above, the optical distance is changed between the respective light-emitting elements in the blue, green, and red pixels in the light-emitting device described in this embodiment. A desired spectrum is intensified by a microcavity in each light-emitting element, whereby the light-emitting device can have high color purity. Further, the transparent electrode layer is not provided in the light-emitting element in the blue pixel, by which the number of masks, the number of manufacturing steps, and manufacturing costs can be reduced.

Hereinafter, the top-emission light-emitting device in which a white-light-emitting element and a color filter are used in combination, which is described in this embodiment (the structure is hereinafter abbreviated to a white, CF, TE structure) is compared to a top-emission light-emitting device in which light-emitting elements are formed using a separate coloring method (the structure is hereinafter abbreviated to a separate coloring, TE structure). The separate coloring method is a method of separately depositing respective materials of RGB for pixels by a vapor-deposition method or the like.

First, for colorization, a color filter is used in the case of the white, CF, TE structure, and thus the color filter is needed. On the other hand, colorization is performed separately per pixel by a vapor-deposition method or the like in the case of the separate coloring, TE structure, and thus no color filter is needed. However, the separate coloring, TE structure involves a metal mask or the like for separate coloring. Separate coloring can also be performed using an inkjet method or the like without using a metal mask; however, many technical problems have remained and that is difficult. In the case where a metal mask is used, a deposition material is also deposited on the metal mask, which deteriorates the efficiency of the use of the material and increases costs. In addition, the metal mask is in contact with the light-emitting element, leading to breakdown of the light-emitting element, damage, particles, and the like by the contact, so that the yield is reduced.

Further, in the case of the white, CF, TE structure, external light reflection is suppressed, and therefore provision of a polarizer can be omitted. On the other hand, a polarizer is needed to prevent the external light reflection in the separate coloring, TE structure. The enhancement of the color purity using a microcavity can be applied to both of the white, CF, TE structure and the separate coloring, TE structure.

Next, as for the pixel size, a margin for separate coloring needs to be provided between pixels in the separate coloring, TE structure. Therefore, the size of each pixel cannot be increased. Consequently, the aperture ratio is drastically reduced. On the other hand, there is no need to provide a margin for separate coloring between pixels in the white, CF, TE structure, and thus the size of each pixel can be increased and the aperture ratio can be increased accordingly.

The light-emitting device includes in its category a medium-size one, which is inches or less in diagonal, or a small-size one which are used for a mobile phone and the like, and a large-size one which is several tens to several hundreds of inches in diagonal used for a television set and the like.

In the case of manufacturing a large-size light-emitting device, a manufacturing technique adaptable for the light-emitting device is indispensable. In the separate coloring, TE structure, the technique and production facility of a metal mask for a large size have not been established yet, which makes it difficult to realize the separate coloring, TE structure. Further, even the establishment of the technique and production facility of a metal mask for a large size does not resolve such a problem in the efficiency of the use of the material that the deposition material is also deposited on a metal mask. On the other hand, the white, CF, TE structure can be manufactured with an existing production facility because a metal mask is not needed, which is preferable.

A manufacturing device of a light-emitting device is an indispensable factor for the yield of the light-emitting devices. For example, in the case where the light-emitting element has a structure in which a plurality of stacked-layer structures are stacked, a plurality of deposition sources is preferably deposited over a substrate at once or consecutively with in-line or multi-chamber equipment for manufacturing the light-emitting device. In the case of the separate coloring, TE structure, a metal mask is changed to be aligned with separate coloring per pixel, which makes it difficult to use in-line or multi-chamber manufacturing equipment. On the other hand, in the case of the white, CF, TE structure, in-line or multi-chamber manufacturing equipment can be easily used since no metal mask is needed.

Comparing with a liquid crystal display device, the light-emitting device described in this embodiment is of self-luminous type and thus needs no backlight, resulting in higher contrast and lower power consumption. No need of backlight also enables reductions in thickness and weight. Further, the light-emitting device described in this embodiment and a touch panel can be formed monolithically.

As described above, the light-emitting device which is one embodiment of the present invention is greatly superior to a conventional light-emitting device.

This embodiment can be implemented in appropriate combination with any structure described in the other embodiments.

Embodiment 5

Figure 5A:
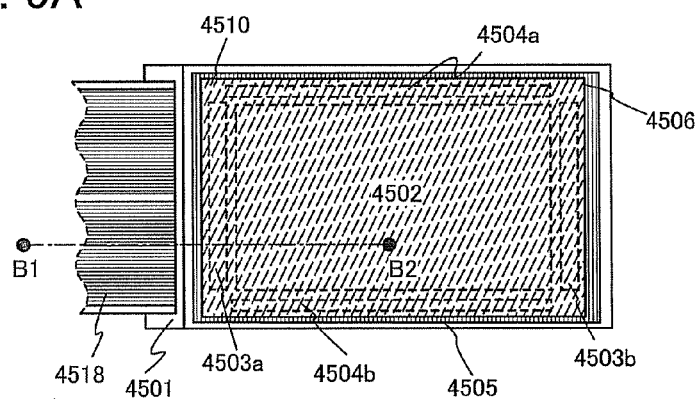
FIGS. 5A and 5B illustrate a light-emitting device.
Figure 5B:
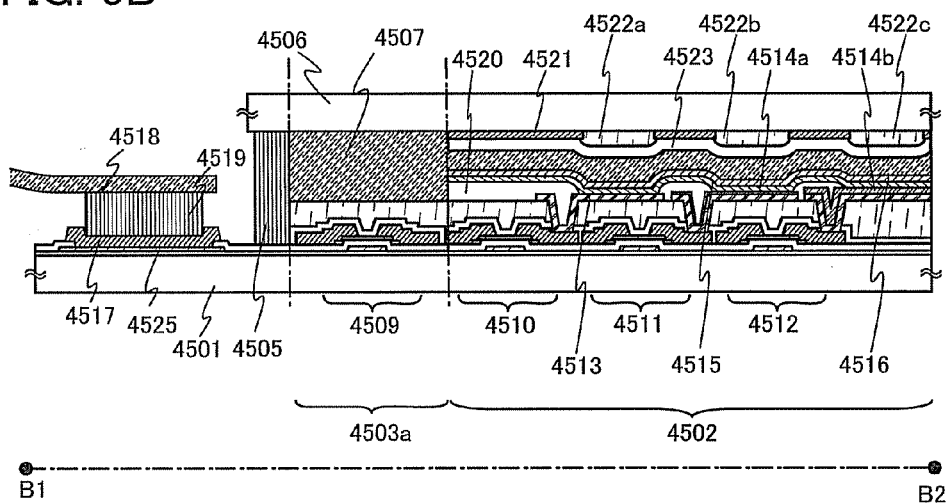

In this embodiment, an appearance and a cross section of a display device (also referred to as a display panel or a light-emitting panel) which is one embodiment of a light-emitting device of the present invention are described using FIGS. 5A and 5B. FIG. 5A is a plan view of a panel in which a transistor for driving a light-emitting element and a light-emitting element which are provided over a first substrate, and a light-shielding film, color filters, and an overcoat provided on a second substrate are sealed with a sealant. FIG. 5B corresponds to a cross-sectional diagram cut along dotted line B1-B2 in FIG. 5A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b.

Further, a light-shielding film 4521, a blue color filter 4522a, a green color filter 4522b, a red color filter 4522c, and an overcoat 4523 are provided on the second substrate 4506. The light-shielding film 4521, the blue color filter 4522a, the green color filter 4522b, the red color filter 4522c, and the overcoat 4523 can be formed in manners which are the same as respective those provided on the second substrate 251 described in Embodiment 4.

With such a structure, the pixel portion 4502, the signal line driver circuit 4503a, the signal line driver circuit 4503b, the scan line driver circuit 4504a, and the scan line driver circuit 4504b are hermetically sealed together with a filler 4507 by the first substrate 4501, the sealant 4505, and the second substrate 4506. It is preferable that the panel be packaged (sealed) with a protective film (an attachment film, an ultraviolet curable resin film, or the like) or a cover material with less degasification such that the panel is not exposed to the outside air, which is because the air-tightness becomes high.

Further, the pixel portion 4502, the signal line driver circuit 4503a, the signal line driver circuit 4503b, the scan line driver circuit 4504a, and the scan line driver circuit 4504b which are provided over the first substrate 4501 each include a plurality of transistors. Transistors 4510, 4511, and 4512 included in the pixel portion 4502 and a transistor 4509 included in the signal line driver circuit 4503a are shown in FIG. 5B.

The transistors 4509 to 4512 can be formed by a method similar to that of the transistor 230 described in Embodiment 4.

Further, reflection electrode layers 4513 which are in contact with a light-emitting layer 4515 are provided in light-emitting elements, respectively. The reflection electrode layer 4513 is electrically connected to a source or drain electrode of corresponding one of the transistors 4510 to 4512. The element structure described in Embodiment 3 can be applied to the structure of the light-emitting layer 4515.

A light-emitting element under the blue color filter 4522a includes the reflection electrode layer 4513, the light-emitting layer 4515, and a transflective electrode layer 4516. A light-emitting element under the green color filter 4522b includes the corresponding reflection electrode layer 4513, a first transparent electrode layer 4514a, the light-emitting layer 4515, and the transflective electrode layer 4516. A light-emitting element under the red color filter 4522c includes the corresponding reflection electrode layer 4513, a second transparent electrode layer 4514b, the light-emitting layer 4515, and the transflective electrode layer 4516.

As described above, the structure is changed between the respective light-emitting elements under the blue, green, and red color filters. A desired spectrum is intensified by a microcavity in each light-emitting element, and light with the intensified spectrum passes through the color filter, providing emission with higher color purity.

A bank 4520 is formed using an organic resin film, an inorganic insulating film, or organo polysiloxane. It is particularly preferable that the bank 4520 be formed using a photosensitive material to have openings over the reflection electrode layer 4513, the first transflective electrode layer 4514a, and the second transflective electrode layer 4514b so that a sidewall of each opening has an inclined surface with continuous curvature.

The light-emitting layer 4515 may have a single-layer or stacked-layer structure. A protective film may be formed over the transflective electrode layer 4516 in order to prevent entry of oxygen, hydrogen, moisture, carbon dioxide, or the like into the light-emitting layer 4515. As the protective film, a silicon nitride film, a silicon nitride oxide film, or the like can be formed.

In addition, a variety of signals and potentials are supplied from an FPC 4518 to the signal line driver circuit 4503a, the signal line driver circuit 4503b, the scan line driver circuit 4504a, the scan line driver circuit 4504b, or the pixel portion 4502.

A connection terminal electrode 4517 is formed of the same conductive film as each source or drain electrode of the transistors 4510 to 4512, and a terminal electrode 4525 is formed of the same conductive film as each gate electrode of the transistors 4510 to 4512.

The connecting terminal electrode 4517 is electrically connected to a terminal included in the FPC 4518 through an anisotropic conductive film 4519.

Light from the light-emitting layer 4515 is extracted from the second substrate 4506 side. Therefore, the second substrate 4506 needs to have a light-transmitting property; for example, a glass plate, a plastic plate, a polyester film, an acrylic film, or the like is used as a material of the second substrate 4506.

As the filler 4507, an ultraviolet curable resin or a thermosetting resin can be used, as well as an inert gas such as nitrogen or argon. For example; PVC (polyvinyl chloride), acrylic, polyimide, an epoxy resin, a silicone resin, PVB (polyvinyl butyral), or EVA (ethylene vinyl acetate) can be used. For example, nitrogen may be used for the filler.

If necessary, an optical film such as a polarizing plate, a circularly polarizing plate (including an elliptically polarizing plate), a retardation plate (a quarter-wave plate or a half-wave plate), or the like may be appropriately provided for the second substrate 4506. Further, the polarizing plate or the circularly polarizing plate may be provided with an anti-reflection film. For example, anti-glare treatment by which reflected light can be diffused by unevenness of the surface to reduce glare can be performed.

As the signal line driver circuit 4503a, the signal line driver circuit 4503b, the scan line driver circuit 4504a, and the scan line driver circuit 4504b, driver circuits formed by using a single crystal semiconductor film or a polycrystalline semiconductor film over other substrates/another substrate may be mounted. Only the signal line driver circuits or part thereof, or only the scan line driver circuits or part thereof may be separately formed and mounted. One embodiment of the present invention is not limited to the structure shown in FIGS. 5A and 5B.

As described above, the optical distance is changed between the respective light-emitting elements under the blue, green, and red color filters in the light-emitting device described in this embodiment. A desired spectrum is intensified by a microcavity in each light-emitting element, whereby the light-emitting device can have high color purity. Further, the transparent electrode layer is not provided in the light-emitting element under the blue color filter, by which the number of masks, the number of manufacturing steps, and manufacturing costs can be reduced.

This embodiment can be implemented in appropriate combination with any structure described in the other embodiments.

Embodiment 6

In this embodiment, electronic devices each including the light-emitting device described in any of Embodiments 1 to 5 are described.

Examples of the electronic device including the light-emitting device described in any of Embodiments 1 to 5 include cameras such as video cameras and digital video cameras, goggle type displays, navigation systems, audio playback devices (e.g., car audio systems and audio systems), computers, game machines, portable information terminals (e.g., mobile computers, mobile phones, portable game machines, and electronic books), image playback devices with a recording medium (specifically, devices that are capable of playing back recording media such as digital versatile discs (DVDs) and equipped with a display unit that can display images thereof), and the like. Specific examples of those electronic devices are illustrated in FIGS. 6A to 6D.

Figure 6A:
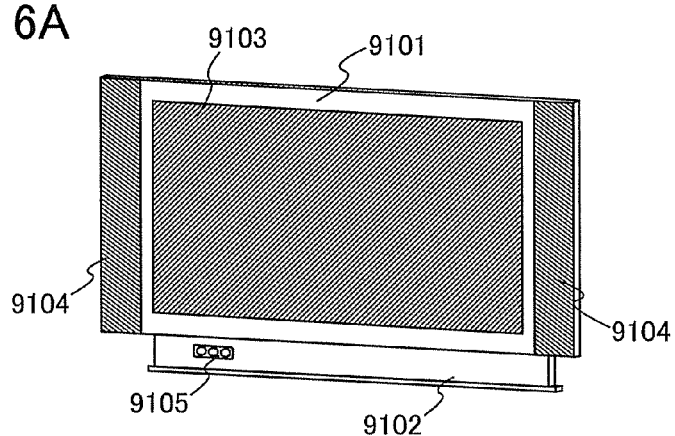
FIGS. 6A to 6D are views each illustrating an electronic device using a light-emitting device.

FIG. 6A shows a television device which includes a housing 9101, a supporting base 9102, a display portion 9103, speaker portions 9104, video input terminals 9105, and the like. In the television device, the light-emitting device described in any of Embodiments 1 to 5 is used for the display portion 9103. The light-emitting device whose desired spectrum is intensified by a microcavity is used in the display portion 9103, whereby the television device has high color purity.

Figure 6B:
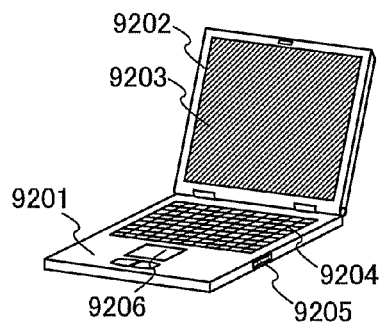

FIG. 6B shows a computer which includes a main body 9201, a housing 9202, a display portion 9203, a keyboard 9204, an external connection port 9205, and a pointing device 9206. In the computer, the light-emitting device described in any of Embodiments 1 to 5 is used for the display portion 9203. The light-emitting device whose desired spectrum is intensified by a microcavity is used in the display portion 9203, whereby the computer has high color purity.

Figure 6C:
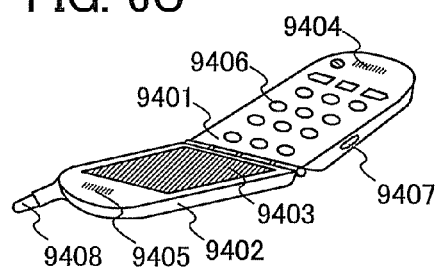

FIG. 6C shows a mobile phone which includes a main body 9401, a chassis 9402, a display portion 9403, an audio input portion 9404, an audio output portion 9405, an operation key 9406, an external connection port 9407, an antenna 9408, and the like. In the mobile phone, the light-emitting device described in any of Embodiments 1 to 5 is used for the display portion 9403. The light-emitting device whose desired spectrum is intensified by a microcavity is used in the display portion 9403, whereby the mobile phone has high color purity.

Figure 6D:
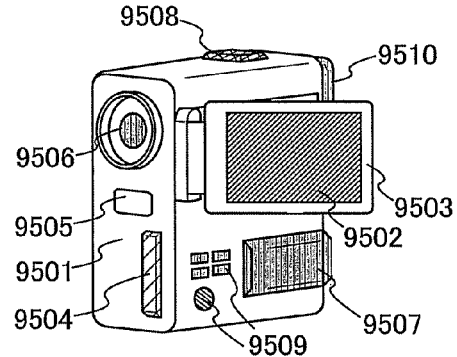

FIG. 6D shows a digital video camera which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In the digital video camera, the light-emitting device described in any of Embodiments 1 to 5 is used for the display portion 9502. The light-emitting device whose desired spectrum is intensified by a microcavity is used in the display portion 9502, whereby the digital video camera has high color purity.

As described above, the application range of the light-emitting device described in any of Embodiments 1 to 5 is so wide that the light-emitting device can be applied to electronic devices of various fields.

This embodiment can be implemented in appropriate combination with any structure described in the other embodiments.

Embodiment 7

Figure 9:
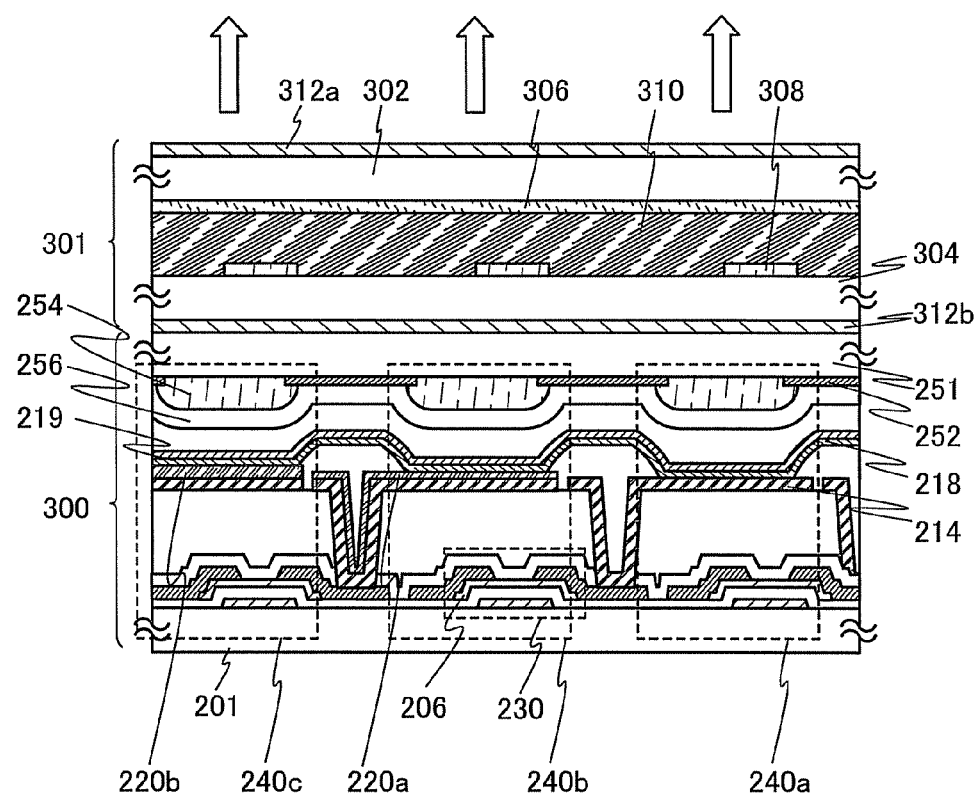
FIG. 9 is a diagram illustrating a light-emitting device.

In this embodiment, an example of a light-emitting device using the light-emitting device described in Embodiment 4 is described using FIG. 9.

A light-emitting device shown in FIG. 9 is a cross-sectional diagram corresponding to part of pixels of a light-emitting device in which a light-emitting device 300, which is the one shown in FIGS. 4A to 4C, is combined with a switching liquid-crystal panel 301.

The switching liquid-crystal panel 301 functions as a so-called parallax barrier. With the switching liquid-crystal panel 301, parallax is provided for light from the light-emitting device 300 is emitted to a certain direction, which enables 3D (three-dimensional) display.

In this embodiment, with the parallax barrier, a light-shielding region (barrier region) is provided against light emitted from the light-emitting device 300 to give a certain viewing angle to change the space region of light emission between for the right eye and for the left eye, so that viewers can recognize respective images for the eyes as 3D (three-dimensional) display. Further, when the light-shielding region is not provided, 2D display can be performed; the switching liquid-crystal panel 301 can switch 3D and 2D displays.

The light-emitting device 300 is the light-emitting device described in Embodiment 4, in which the blue pixel 240a, the green pixel 240b, and the red pixel 240c are provided between the first substrate 201 and the second substrate 251. Further, over the first substrate 201, the transistor 230 for controlling driving of the light-emitting element and the reflection electrode layer 214 which is electrically connected to the transistor 230 are provided.

In this embodiment, the blue pixel 240a includes the light-emitting element whose emission peaks in the wavelength range of blue, the green pixel 240b includes the light-emitting element whose emission peaks in the wavelength range of green, and the red pixel 240c includes the light-emitting element whose emission peaks in the wavelength range of red.

In the blue pixel 240a, the light-emitting layer 218 is directly formed on the reflection electrode layer 214 and the transflective electrode layer 219 is formed over the light-emitting layer 218 in the light-emitting element for blue. In the green pixel 240b, the first transparent electrode layer 220a is formed over the reflection electrode layer 214, the light-emitting layer 218 is formed over the first transparent electrode layer 220a, and the transflective electrode layer 219 is formed over the light-emitting layer 218 in the light-emitting element for green. In the red pixel 240c, the second transparent electrode layer 220b is formed over the reflection electrode layer 214, the light-emitting layer 218 is formed over the second transparent electrode layer 220b, and the transflective electrode layer 219 is formed over the light-emitting layer 218 in the light-emitting element for red.

In this manner, the structure between the reflection electrode layer 214 and the transflective electrode layer 219 in the light-emitting element is different per pixel (the blue pixel 240a, the green pixel 240b, the red pixel 240c).

The second substrate 251 is provided with the light-shielding film 252 which functions as a black matrix, the color filter 254, and the overcoat 256. The color filter 254 is a coloring layer, through which light corresponding to the color (blue, green, or red) of light emitted from the light-emitting element passes to be extracted from the second substrate 251 side.

In this manner, the light path length between the reflection electrode layer 214 and the transflective electrode layer 219 is changed in the light-emitting element depending on the pixel (the blue pixel 240a, the green pixel 240b, the red pixel 240c) to change the optical distance. The optical distance may be adjusted to the light path length so as to amplify a spectrum for the light-emitting element in the pixel by a resonance effect. The light-emitting layer 218 is directly formed on the reflection electrode layer 214, and the transflective electrode layer 219 is formed over the light-emitting layer 218 in the light-emitting element in the blue pixel 240a, i.e., a transparent electrode layer (the first transparent electrode layer 220a, the second transparent electrode layer 220b) is not formed in the light-emitting element in the blue pixel 240a.

With the structure, the number of masks, the number of manufacturing steps, and manufacturing costs can be reduced because the transparent electrode layer is not needed in the blue pixel 240a.

In the switching liquid-crystal panel 301, a liquid-crystal layer 310 is provided between a third substrate 302 and a fourth substrate 304, the third substrate 302 is provided with a common electrode 306, and the fourth substrate 304 is provided with patterned electrodes 308. Further, the third substrate 302 and the fourth substrate 304 are provided with polarizers 312a and 312b, respectively.

The third substrate 302 and the fourth substrate 304 each can be formed using a light-transmitting material; for example, a glass substrate or the like can be used. The common electrode 306 and the patterned electrodes 308 each can be formed using a light-transmitting conductive material; for example, ITO can be used. The shape of the patterned electrode 308 can be adjusted as appropriate. The liquid-crystal layer 310 and the polarizers 312a and 312b can be formed using respective known materials.

The light-emitting device 300 is attached to the switching liquid-crystal panel 301, so that a light-emitting device capable of performing 3D display can be provided. A transparent layer (e.g., an acrylic resin layer) may be provided as a spacer between the light-emitting device 300 and the switching liquid-crystal panel 301 to keep an appropriate distance therebetween.

In the switching liquid-crystal panel 301, a region where the patterned electrode 308 is provided can be turned into a light-shielding region by applying a voltage to the patterned electrode 308, i.e., can shield part of light emitted from the light-emitting device 300 to function as a parallax barrier. On the other hand, when no voltage is applied to the patterned electrode 308, the region where the patterned electrode 308 is provided is a light-transmitting region, i.e., all of light emitted from the light-emitting device 300 can pass through the switching liquid-crystal panel 301. That is, 3D display can be performed when a voltage is applied to the patterned electrode 308 whereas 2D display can be performed when no voltage is applied to the patterned electrode 308.

As described above, the light-transmitting device of one embodiment of the present invention can be used as a light-transmitting device capable of performing 3D display in combination with the switching liquid-crystal panel.

As described above, a desired spectrum is intensified by a microcavity in each light-emitting element in the light-emitting device described in this embodiment, whereby the light-emitting device can have high color purity. Further, a light-emitting device capable of switching 3D display and 2D display can be provided in combination with a switching liquid-crystal panel.

This embodiment can be implemented in appropriate combination with any structure described in the other embodiments.

Example 1

In this example, the light-emitting elements shown in FIG. 1B described in Embodiment 1 and the light-emitting elements shown in FIG. 1B each with a color filter provided were manufactured, and their emission spectra were measured.

As the light-emitting elements in this example, Light-emitting Elements 1 to 6 were manufactured while changing the presence and thickness of the transparent electrode layer and the presence of the color filter.

Light-emitting Element 1 is a light-emitting element in which the light-emitting layer is directly formed on the reflection electrode layer and a microcavity is used to increase the intensity of blue light in the emission spectrum of the light-emitting layer. Light-emitting Element 2 is a light-emitting element in which the transparent electrode layer with a thickness of 30 nm is formed over the reflection electrode layer and a microcavity is used to increase the intensity of green light in the emission spectrum of the light-emitting layer. Light-emitting Element 3 is a light-emitting element in which the transparent electrode layer with a thickness of 70 nm is formed over the reflection electrode layer and a microcavity is used to increase the intensity of red light in the emission spectrum of the light-emitting layer. Light-emitting Elements 4, 5, and 6 are Light-emitting Elements 1, 2, and 3 with respective color filters, respectively. Table 1 shows structures of Light-emitting Elements 1 to 6 manufactured in this example.

TABLE 1

| | Reflective Electrode Layer | Transparent Electrode Layer | Light-Emitting Layer | 1st Transflective Electrode Layer | 2nd Transflective Electrode Layer | Color Filter |
|---|---|---|---|---|---|---|
| Light-Emitting Element 1 | Al-Ti\Ti 200 nm\6 nm | No | Light-Emitting Layer A | Ag:Mg (=10:1) 10 nm | ITO 50 nm | No |
| Light-Emitting Element 2 | Al-Ti\Ti 200 nm\6 nm | ITO-SiO$_2$ 30 nm | Light-Emitting Layer A | Ag:Mg (=10:1) 10 nm | ITO 50 nm | No |
| Light-Emitting Element 3 | Al-Ti\Ti 200 nm\6 nm | ITO-SiO$_2$ 70 nm | Light-Emitting Layer A | Ag:Mg (=10:1) 10 nm | ITO 50 nm | No |
| Light-Emitting Element 4 | Al-Ti\Ti 200 nm\6 nm | No | Light-Emitting Layer A | Ag:Mg (=10:1) 10 nm | ITO 50 nm | Yes |
| Light-Emitting Element 5 | Al-Ti\Ti 200 nm\6 nm | ITO-SiO$_2$ 30 nm | Light-Emitting Layer A | Ag:Mg (=10:1) 10 nm | ITO 50 nm | Yes |
| Light-Emitting Element 6 | Al-Ti\Ti 200 nm\6 nm | ITO-SiO$_2$ 70 nm | Light-Emitting Layer A | Ag:Mg (=10:1) 10 nm | ITO 50 nm | Yes |

Light-emitting Layer A was used in each of Light-emitting Elements 1 to 6. Light-emitting Layer A formed in this example is a three-wavelength white stacked-layer element (also called a tandem element). A structure of Light-emitting Layer A is shown in Table 2.

TABLE 2

| | Hole-Injection Layer | 1st Hole-Transport Layer | 1st Light-Emitting Layer(Blue) | 1st Electron-Transport Layer | 2nd Electron-Transport Layer | Charge Generation Layer | | |
|---|---|---|---|---|---|---|---|---|
| Light-Emitting Layer A | PCzPA:MoOx (=1:0.5) 30 nm | PCzPA 20 nm | CzPA:1,6-mMemFLPAPrn (=1:0.05) 30 nm | CzPA 5 nm | BPhen 15 nm | Ca 1 nm | CuPc 2 nm | PCzPA:MoOx (=1:0.5) 30 nm |

| | 2nd Hole-Transport Layer | 2nd Light-Emitting Layer(Green) | 3rd Light-Emitting Layer(Red) | 3rd Electron-Transport Layer | 4th Electron-Transport Layer | Electron-Injection Layer |
|---|---|---|---|---|---|---|
| → | BPAFLP 20 nm | 2mDBTPDBq:PCBA1BP:Ir(mppm)2acac (=0.8:0.2:0.06) 20 nm | 2mDBTPDBq II:Ir(tppr)2dpm (=1:0.02) 20 nm | 2mDBTPDBq II 15 nm | BPhen 15 nm | LiF 1 nm |

The structures of Light-emitting Elements 1 to 6 are the same as each other except the transparent electrode layer and the color filter.

Methods for manufacturing Light-emitting Elements 1 to 6 are described hereinbelow.

(Light-Emitting Element 1)

First, Al—Ti and Ti were deposited consecutively over a glass substrate by a sputtering method to form the reflection electrode layer. The thicknesses of Al—Ti and Ti were 200 nm and 6 nm, respectively and the area of the reflection electrode layer was 2 mm×2 mm. At least part of Ti (6 nm) over Al—Ti is oxidized.

Next, as pretreatment for forming the light-emitting element, a surface of the substrate was washed with water, baked at 200° C. for one hour, and subjected to UV ozone treatment for 370 seconds. Then, the substrate was transferred into a vacuum evaporation apparatus whose pressure was reduced to about $10^{-4}$ Pa, vacuum baking at 170° C. for 30 minutes was performed in a heating chamber of the vacuum evaporation apparatus, and then the substrate was cooled down for about 30 minutes.

Then, the substrate was fixed to a substrate holder in the vacuum evaporation apparatus such that the side where the reflection electrode layer was provided is downward, the pressure was reduced to about $10^{-4}$ Pa, and then, Light-emitting Layer A was formed over the reflection electrode layer.

In Light-emitting Layer A, first, 9-[4-(9-phenylcarbazol-3-yl)]phenyl-10-phenylanthracene (abbreviation: PCzPA; chemical formula: (100)) and molybdenum oxide were deposited by a co-evaporation method to form the hole-injection layer. The thickness thereof was 30 nm, and the weight ratio of PCzPA to molybdenum oxide was adjusted to 1:0.5 (=PCzPA:molybdenum oxide). The co-evaporation method refers to an evaporation method in which deposition is carried out from a plurality of evaporation sources at the same time in one treatment chamber.

[Chemical Formula 1]

(100)

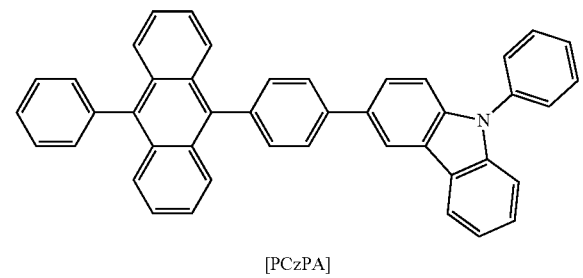

[PCzPA]

Next, a PCzPA film was formed to a thickness of 20 nm over the hole-injection layer to form a first hole-transport layer.

Then, 9-[4-(N-carbazolyl)]phenyl-10-phenylanthracene (abbreviation: CzPA; chemical formula: (101)) and N,N'-bis(3-methylphenyl)-N,N'-bis[3-(9-phenyl-9H-fluoren-9-yl)phenyl]-pyrene-1,6-di amine (abbreviation: 1,6mMemFLPAPrn; chemical formula: (102)) were deposited by a co-evaporation method over the first hole-transport layer, so that a first light-emitting layer was formed. The thickness of the first light-emitting layer was 30 nm. The weight ratio of CzPA to 1,6mMemFLPAPrn was adjusted to 1:0.05 (=CzPA:1,6mMemFLPAPrn).

[Chemical Formula 2]

(101)

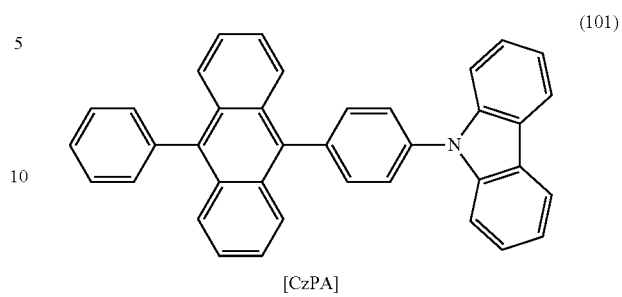

[CzPA]

(102)

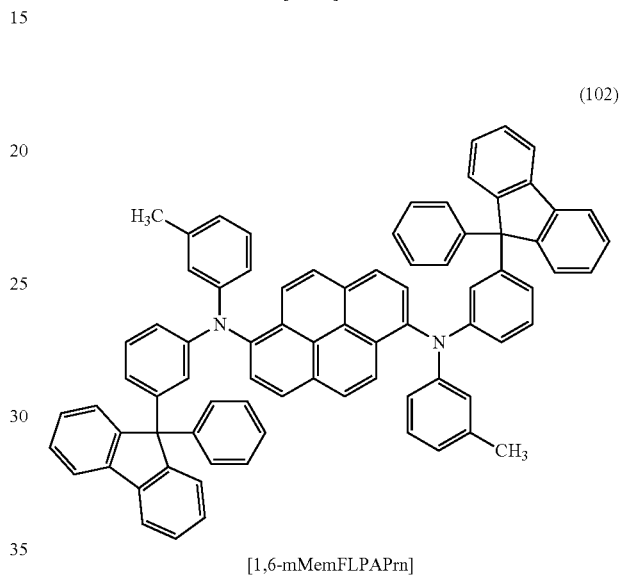

[1,6-mMemFLPAPrn]

Next, a CzPA film was formed to a thickness of 5 nm over the first light-emitting layer to form a first electron-transport layer. Then, bathophenanthroline (abbreviation: BPhen; chemical formula: (103)) was deposited over the first electron-transport layer to a thickness of 15 nm to form a second electron-transport layer.

[Chemical Formula 3]

(103)

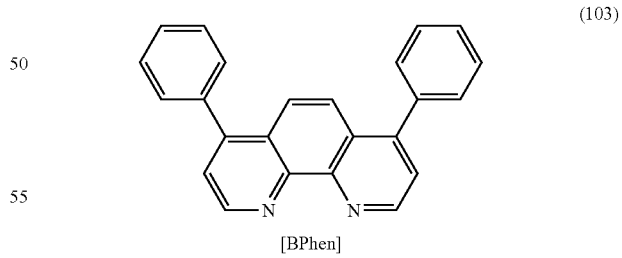

[BPhen]

Next, a charge generation layer was formed over the second electron-transport layer. As the charge generation layer, over the second electron-transport layer, Ca, copper(II) phthalocyanine (abbreviation: CuPc; chemical formula: (104)), and a co-evaporated film of PCzPA and molybdenum oxide (1:0.5=PCzPA:molybdenum oxide in weight ratio) were sequentially deposited to thicknesses of 1 nm, 2 nm, and 30 nm, respectively.

[Chemical Formula 4]

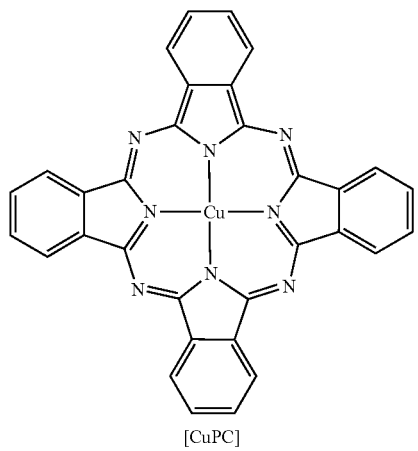

[CuPC] (104)

Next, over the charge generation layer, 4-phenyl-4'-(9-phenylfluoren-9-yl)triphenylamine (abbreviation: BPAFLP; chemical formula: (105)) was deposited to a thickness of 20 nm as a second hole-transport layer.

[Chemical Formula 5]

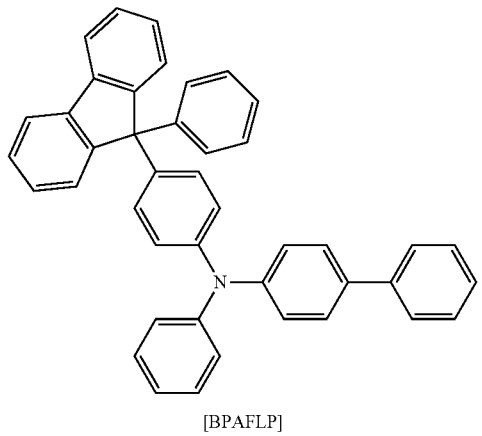

[BPAFLP] (105)

After that, a second light-emitting layer was formed over the second hole-transport layer. The second light-emitting layer was formed by co-evaporation of 2-[3-(dibenzothiophen-4-yl)phenyl]dibenzo[f,h]quinoxaline (abbreviation: 2mDBTPDBq-II; chemical formula: (106)), 4-phenyl-4'-(9-phenyl-9H-carbazol-3-yl)triphenylamine (abbreviation: PCBA1BP; chemical formula: (107)), and (acetylacetonato)bis(6-methyl-4-phenylpyrimidinato)iridium(III) (abbreviation: [Ir(mppm)$_2$(acac)]; chemical formula: (108)). The weight ratio of 2mDBTPDBq-II to PCBA1BP to [Ir(mppm)$_2$(acac)] was adjusted to 0.8:0.2:0.06 (=2mDBTPDBq-II:PCBA1BP:[Ir(mppm)$_2$(acac)]). In addition, the thickness of the second light-emitting layer was 20 nm.

[Chemical Formula 6]

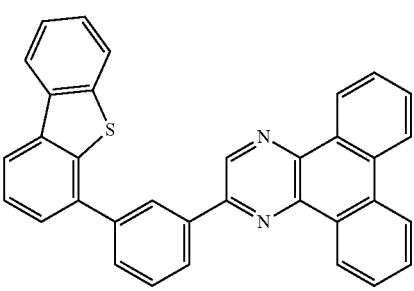

[2mDBTPDBq-II] (106)

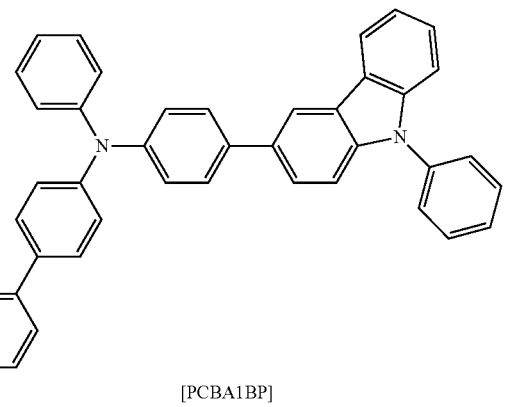

[PCBA1BP] (107)

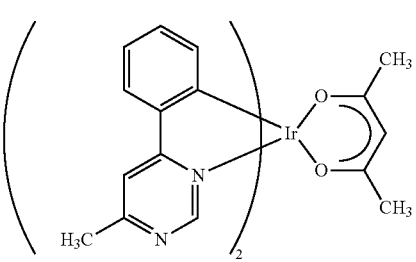

[Ir(mppm)2(acac)] (108)

Next, a third light-emitting layer was formed over the second light-emitting layer. The third light-emitting layer was formed by co-evaporation of 2mDBTPDBq-II and bis(2,3,5-triphenylpyrazinato)(dipivaloylmethanato)iridium(III) (abbrebiation: Ir(tppr)$_2$(dpm); chemical formula: (109)). The thickness of the third light-emitting layer was 20 nm. The weight ratio of 2mDBTPDBq-II to Ir(tppr)$_2$(dpm) was adjusted to 1:0.02 (=2mDBTPDBq-II:Ir(tppr)$_2$(dpm)).

[Chemical Formula 7]

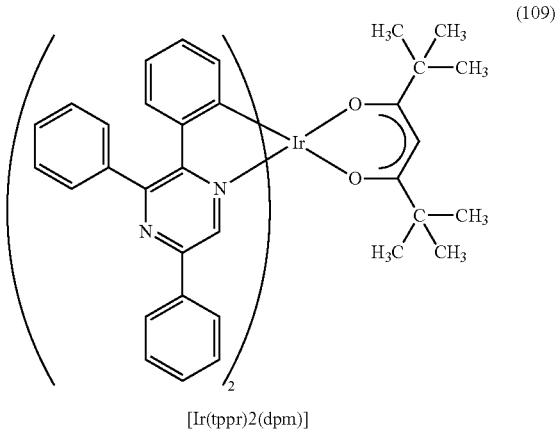

[Ir(tppr)2(dpm)]

Then, 2mDBTPDBq-II was deposited to a thickness of 15 nm as a third electron-transport layer over the third light-emitting layer.

Then, BPhen (abbrebiation) was deposited to a thickness of 15 nm as a fourth electron-transport layer over the third electron-transport layer.

Further, lithium fluoride (LiF) was deposited to a thickness of 1 nm over the fourth electron-transport layer to form an electron-injection layer.

Next, the first transflective electrode layer was formed by co-evaporation of silver (Ag) and magnesium (Mg). The thickness thereof was 10 nm, and the volume ratio of Ag to Mg was adjusted to 10:1 (=Ag:Mg).

Finally, the second transflective electrode layer was formed by depositing ITO to a thickness of 50 nm. In this manner, Light-emitting Element 1 in this example was manufactured.

Next, a method for manufacturing Light-emitting Element 2 in this example is described below. Description on part of the structure of Light-emitting Element 2 which is the same as that of Light-emitting Element 1 is not repeated.

(Light-Emitting Element 2)

First, Al—Ti and Ti were deposited consecutively over a glass substrate by a sputtering method to form the reflection electrode layer. The thicknesses of Al—Ti and Ti were 200 nm and 6 nm, respectively and the area of the reflection electrode layer was 2 mm×2 mm. At least part of Ti (6 nm) over Al—Ti is oxidized.

Next, the transparent electrode layer was formed by a sputtering method using a target in which silicon oxide is contained in an indium oxide-tin oxide alloy (abbreviation: ITO—SiO$_2$; composition ratio: In$_2$O$_3$:SnO$_2$:SiO$_2$=85:10:5 [weright %]). The thicknesses of ITO—SiO$_2$ was 30 nm, and the area of the transparent electrode layer was 2 mm×2 mm.

Next, as pretreatment for forming the light-emitting element, a surface of the substrate was washed with water, baked at 200° C. for one hour, and subjected to UV ozone treatment for 370 seconds. Then, the substrate was transferred into a vacuum evaporation apparatus whose pressure was reduced to about 10$^{-4}$ Pa, vacuum baking at 170° C. for 30 minutes was performed in a heating chamber of the vacuum evaporation apparatus, and then the substrate was cooled down for about 30 minutes.

Then, the substrate was fixed to a substrate holder in the vacuum evaporation apparatus such that the side where the transparent electrode layer was provided is downward, the pressure was reduced to about 10$^{-4}$ Pa, and then, Light-emitting Layer A was formed over the transparent electrode layer. Light-emitting Layer A was formed in a manner similar to that in Light-emitting Element 1.

After formation of Light-emitting Layer A, the first transflective electrode layer was formed by co-evaporation of silver (Ag) and magnesium (Mg). The thickness thereof was 10 nm, and the volume ratio of Ag to Mg was adjusted to 10:1 (=Ag:Mg).

Finally, the second transflective electrode layer was formed by depositing ITO to a thickness of 50 nm. In this manner, Light-emitting Element 2 in this example was manufactured.

Next, a method for manufacturing Light-emitting Element 3 in this example is described below. Description on part of the structure of Light-emitting Element 3 which is the same as that of Light-emitting Element 1 is not repeated.

(Light-Emitting Element 3)

First, Al—Ti and Ti were deposited consecutively over a glass substrate by a sputtering method to form the reflection electrode layer. The thicknesses of Al—Ti and Ti were 200 nm and 6 nm, respectively and the area of the reflection electrode layer was 2 mm×2 mm. At least part of Ti (6 nm) over Al—Ti is oxidized.

Next, the transparent electrode layer was formed by a sputtering method using a target in which silicon oxide is contained in an indium oxide-tin oxide alloy (abbreviation: ITO—SiO$_2$; composition ratio: In$_2$O$_3$:SnO$_2$:SiO$_2$=85:10:5 [weright %]). The thicknesses of ITO—SiO$_2$ was 70 nm, and the area of the transparent electrode layer was 2 mm×2 mm.

Next, as pretreatment for forming the light-emitting element, a surface of the substrate was washed with water, baked at 200° C. for one hour, and subjected to UV ozone treatment for 370 seconds. Then, the substrate was transferred into a vacuum evaporation apparatus whose pressure was reduced to about 10$^{-4}$ Pa, vacuum baking at 170° C. for 30 minutes was performed in a heating chamber of the vacuum evaporation apparatus, and then the substrate was cooled down for about 30 minutes.

Then, the substrate was fixed to a substrate holder in the vacuum evaporation apparatus such that the side where the transparent electrode layer was provided is downward, the pressure was reduced to about 10$^{-4}$ Pa, and then, Light-emitting Layer A was formed over the transparent electrode layer. Light-emitting Layer A was formed in a manner similar to that in Light-emitting Element 1.

After formation of Light-emitting Layer A, the first transflective electrode layer was formed by co-evaporation of silver (Ag) and magnesium (Mg). The thickness thereof was 10 nm, and the volume ratio of Ag to Mg was adjusted to 10:1 (=Ag:Mg).

Finally, the second transflective electrode layer was formed by depositing ITO to a thickness of 50 nm. In this manner, Light-emitting Element 3 in this example was manufactured.

Next, a method for manufacturing Light-emitting Element 4 in this example is described below.

(Light-Emitting Element 4)

The manufacturing process of Light-emitting Element 1 was performed to form the layers up to and including the second transflective electrode layer, and then, a color filter through which light in the wavelength range of blue can pass was formed by a spin-coating method. In this manner, Light-emitting Element 4 in this example was manufactured.

Next, a method for manufacturing Light-emitting Element 5 in this example is described below.

(Light-Emitting Element 5)

The manufacturing process of Light-emitting Element 2 was performed to form the layers up to and including the second transflective electrode layer, and then, a color filter through which light in the wavelength range of green can pass was formed by a spin-coating method. In this manner, Light-emitting Element 5 in this example was manufactured.

Next, a method for manufacturing Light-emitting Element 6 in this example is described below.

(Light-Emitting Element 6)

The manufacturing process of Light-emitting Element 3 was performed to form the layers up to and including the second transflective electrode layer, and then, a color filter through which light in the wavelength range of red can pass was formed by a spin-coating method. In this manner, Light-emitting Element 6 in this example was manufactured.

In this example, the reflection electrode layer or both of the reflection electrode layer and the transparent electrode layer functions as an anode, and the first transflective electrode layer and the second transflective electrode layer function as a cathode.

Figure 7A:
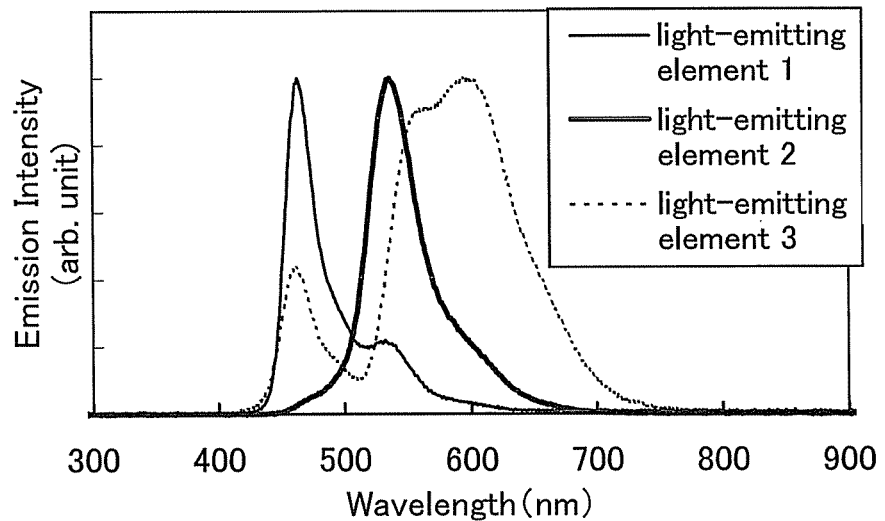
FIGS. 7A and 7B show emission spectra of light-emitting elements each of which is one embodiment of the present invention.

Emission spectra of Light-emitting Elements 1 to 3 are shown in FIG. 7A. It is seen from FIG. 7A that the emission spectrum of Light-emitting Element 1 has a high peak at 464 nm and a low peak at 532 nm; the emission spectrum of Light-emitting Element 2 has a high peak at 537 nm; and the emission spectrum of Light-emitting Element 3 has a high peak at a wavelength from 520 nm to 620 nm and a low peak at 463 nm In this manner, it was able to be confirmed that in Light-emitting Elements 1 to 3, the emission intensity of a desired spectrum can be increased by adjusting the presence and thickness of the transparent electrode layer between the reflection electrode layer and the light-emitting layer.

Figure 7B:
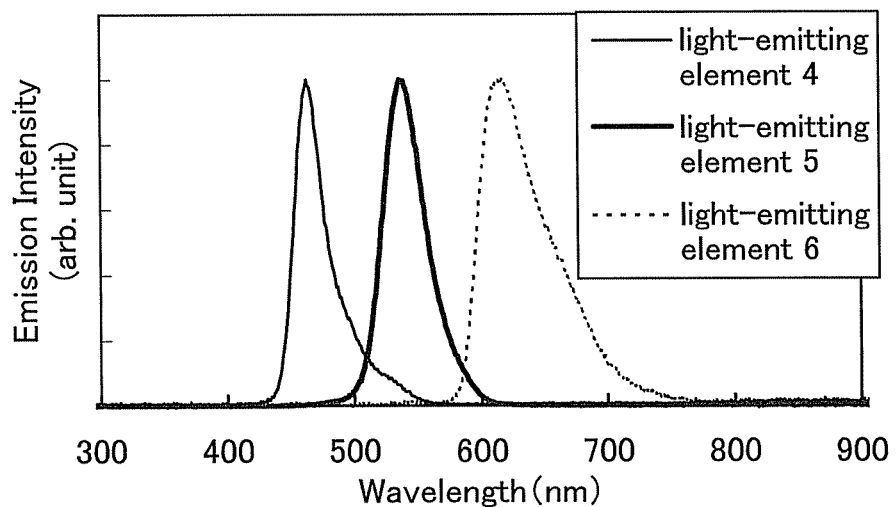

Emission spectra of Light-emitting Elements 4 to 6 are shown in FIG. 7B. It is seen from FIG. 7B that the emission spectrum of Light-emitting Element 4 has a high peak at 463 nm; the emission spectrum of Light-emitting Element 5 has a high peak at 539 nm; and the emission spectrum of Light-emitting Element 6 has a high peak at 617 nm.

In this manner, it was able to be confirmed that in Light-emitting Elements 4 to 6, the emission intensity of a desired spectrum can be increased by adjusting the presence and thickness of the transparent electrode layer between the reflection electrode layer and the light-emitting layer. Further, the line width of each of the spectra was further narrowed by using the color filter in combination. According to measurement of the CIE chromaticity coordinates (x, y) of Light-emitting Elements 4 to 6, Light-emitting Element 4 had (0.14, 0.12), exhibiting light of pure blue; Light-emitting Element 5 had (0.29, 0.69), exhibiting light of pure green; and Light-emitting Element 6 had (0.67, 0.33), exhibiting light of pure red. Further, the NTSC ratio thereof was 86%, meaning high color reproducibility.

In this manner, it was able to be confirmed that in this example, the emission intensity of a desired spectrum can be increased by adjusting the presence and thickness of the transparent electrode layer between the reflection electrode layer and the light-emitting layer. Further, the line width of each of the spectra was further narrowed by using the color filter in combination. The light intensity of a desired wavelength region is increased in this manner, so that the color purity of light from the light-emitting device can be increased.

This example can be implemented in appropriate combination with any structure described in the other embodiments.

Comparative Example 1

For comparison to Light-emitting Elements 1 to 6 described in Example 1, a comparative light-emitting element without a microcavity was manufactured and emission spectrum thereof were measured.

The comparative light-emitting element includes neither the transparent electrode layer nor the first transflective electrode layer between the reflection electrode layer and the second transflective electrode layer. That is, a microcavity effect does not occur between the reflection electrode layer and the second transflective electrode layer. Further, no color filter is provided on the comparative light-emitting element. A structure of the comparative light-emitting element is shown in Table 3.

TABLE 3

| | Reflective Electrode Layer | Transparent Electrode Layer | Light-Emitting Layer | 1st Transflective Electrode Layer | 2nd Transflective Electrode Layer | Color Filter |
|---|---|---|---|---|---|---|
| Comparative Light-Emitting Element | Al-Ti/Ti 200 nm/6 nm | No | Light-Emitting Layer B | No | ITO 110 nm | No |

As a light-emitting layer of the comparative light-emitting element, Light-emitting Layer B whose structure is partly different from that of Light-emitting Layer A of Light-emitting Elements 1 to 6 described in Example 1 was used. A structure of Light-emitting Layer B is shown in Table 4.

TABLE 4

| | Hole-Injection Layer | 1st Hole Transport Layer | 1st Light-Emitting Layer(Blue) | 1st Electron-Transport Layer | 2nd Electron-Transport Layer | 1st Charge Generation Layer | | |
|---|---|---|---|---|---|---|---|---|
| Light-Emitting Layer B | PCzPA: MoOx (=1:0.5) 170 nm | PCzPA 25 nm | CzPA:1,6-mMemFLPAPrn (=1:0.05) 30 nm | CzPA 5 nm | BPhen 15 nm | Ca 1 nm | CuPc 2 nm | PCzPA: MoOx (=1:0.5) 180 nm |
| | 2nd Hole Transport Layer | 2nd Light-Emitting Layer(Green) | 3rd Light-Emitting Layer(Red) | 3rd Electron-Transport Layer | 4th Electron-Transport Layer | 2nd Charge Generation Layer | | |

TABLE 4-continued

| → | BPAFLP 20 nm | 2mDBTPDBq: PCBA1BP: Ir(mppm)2acac (=0.8:0.2:0.06) 20 nm | 2mDBTPDBq II: Ir(tppr)2dpm (=1:0.02) 20 nm | 2mDBTP DBq II 15 nm | BPhen 15 nm | Ca 1 nm | CuPc 2 nm | PCzPA: MoOx (=1:0.5) 10 nm |
|---|---|---|---|---|---|---|---|---|

A method for manufacturing the comparative light-emitting element is described hereinbelow.

(Comparative Light-Emitting Element)

First, Al—Ti and Ti were deposited consecutively over a glass substrate by a sputtering method to form the reflection electrode layer. The thicknesses of Al—Ti and Ti were 200 nm and 6 nm, respectively and the area of the reflection electrode layer was 2 mm×2 mm. At least part of Ti (6 nm) over Al—Ti is oxidized.

Next, as pretreatment for forming the light-emitting element, a surface of the substrate was washed with water, baked at 200° C. for one hour, and subjected to UV ozone treatment for 370 seconds. Then, the substrate was transferred into a vacuum evaporation apparatus whose pressure was reduced to about $10^{-4}$ Pa, vacuum baking at 170° C. for 30 minutes was performed in a heating chamber of the vacuum evaporation apparatus, and then the substrate was cooled down for about 30 minutes.

Then, the substrate was fixed to a substrate holder in the vacuum evaporation apparatus such that the side where the reflection electrode layer was provided is downward, the pressure was reduced to about $10^{-4}$ Pa, and then, Light-emitting Layer B was formed over the reflection electrode layer.

In Light-emitting Layer B, first, 9-[4-(9-phenylcarbazol-3-yl)]phenyl-10-phenylanthracene (abbreviation: PCzPA; chemical formula: (100)) and molybdenum oxide were deposited by a co-evaporation method to form a hole-injection layer. The thickness thereof was 170 nm, and the weight ratio of PCzPA to molybdenum oxide was adjusted to 1:0.5 (=PCzPA:molybdenum oxide). The co-evaporation method refers to an evaporation method in which deposition is carried out from a plurality of evaporation sources at the same time in one treatment chamber.

[Chemical Formula 8]

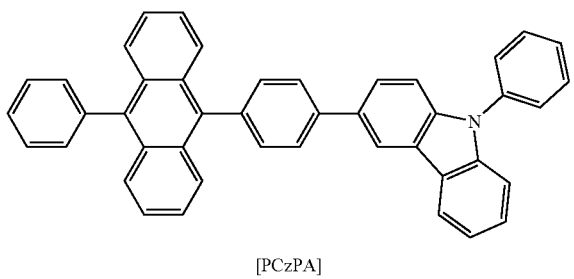

[PCzPA] (100)

Next, a PCzPA film was formed to a thickness of 25 nm over the hole-injection layer to form a first hole-transport layer.

Then, 9-[4-(N-carbazolyl)]phenyl-10-phenylanthracene (abbreviation: CzPA; chemical formula: (101)) and N,N'-bis(3-methylphenyl)-N,N'-bis[3-(9-phenyl-9H-fluoren-9-yl)phenyl]-pyrene-1,6-di amine (abbreviation: 1,6mMemFL-PAPrn; chemical formula: (102)) were deposited by a co-evaporation method over the first hole-transport layer, so that a first light-emitting layer was formed. The thickness of the first light-emitting layer was 30 nm. The weight ratio of CzPA to 1,6mMemFLPAPrn was adjusted to 1:0.05 (=CzPA:1,6mMemFLPAPrn).

[Chemical Formula 9]

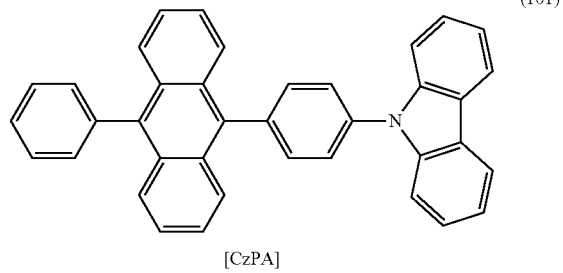

[CzPA] (101)

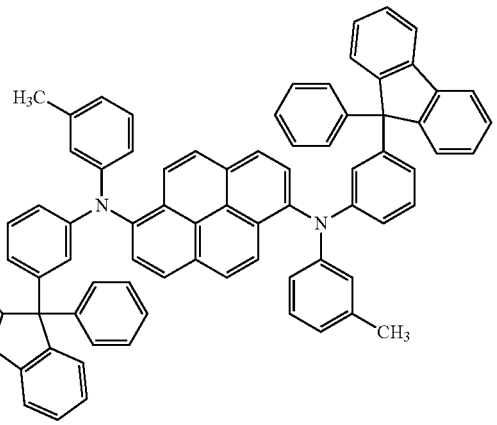

[1,6-mMemFLPAPrn] (102)

Next, a CzPA film was formed to a thickness of 5 nm over the first light-emitting layer to form a first electron-transport layer. Then, bathophenanthroline (abbreviation: BPhen; chemical formula: (103)) was deposited over the first electron-transport layer to a thickness of 15 nm to form a second electron-transport layer.

[Chemical Formula 10]

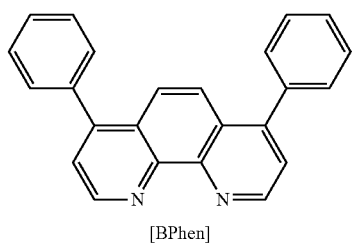

[BPhen] (103)

Next, a first charge generation layer was formed over the second electron-transport layer. As the first charge generation layer, over the second electron-transport layer, Ca, copper(II) phthalocyanine (abbreviation: CuPc; chemical formula: (104)), and a co-evaporated film of PCzPA and molybdenum oxide (1:0.5=PCzPA:molybdenum oxide in weight ratio) were sequentially deposited to thicknesses of 1 nm, 2 nm, and 180 nm, respectively.

[Chemical Formula 11]

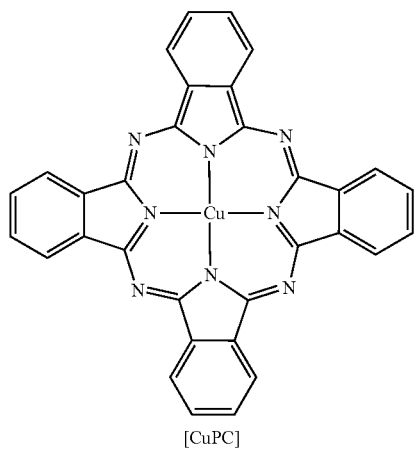

[CuPC] (104)

Next, over the first charge generation layer, 4-phenyl-4'-(9-phenylfluoren-9-yl)triphenylamine (abbreviation: BPAFLP; chemical formula: (105)) was deposited to a thickness of 20 nm as a second hole-transport layer.

[Chemical Formula 12]

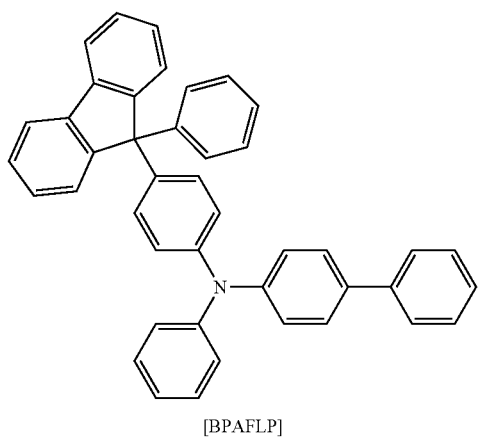

[BPAFLP] (105)

After that, a second light-emitting layer was formed over the second hole-transport layer. The second light-emitting layer was formed by co-evaporation of 2-[3-(dibenzothiophen-4-yl)phenyl]dibenzo[f,h]quinoxaline (abbreviation: 2mDBTPDBq-II; chemical formula: (106)), 4-phenyl-4'-(9-phenyl-9H-carbazol-3-yl)triphenylamine (abbreviation: PCBA1BP; chemical formula: (107)), and (acetylacetonato)bis(6-methyl-4-phenylpyrimidinato)iridium(III) (abbreviation: [Ir(mppm)$_2$(acac)]; chemical formula: (108)). The weight ratio of 2mDBTPDBq-II to PCBA1BP to [Ir(mppm)$_2$(acac)] was adjusted to 0.8:0.2:0.06 (=2mDBTPDBq-II:PCBA1BP:[Ir(mppm)$_2$(acac)]). In addition, the thickness of the second light-emitting layer was 20 nm.

[Chemical Formula 13]

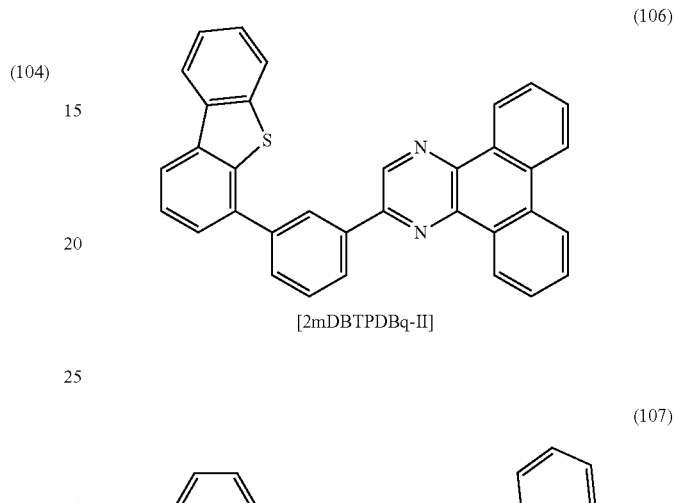

[2mDBTPDBq-II] (106)

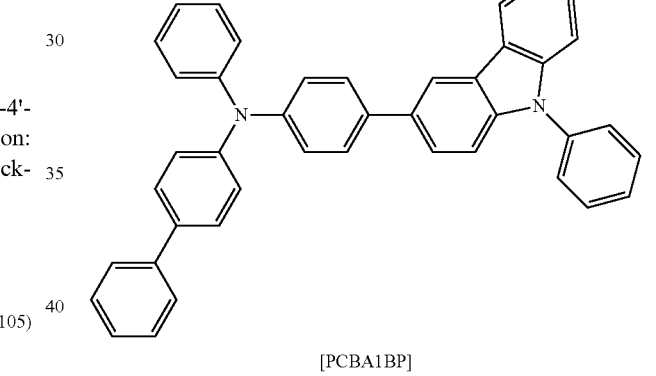

[PCBA1BP] (107)

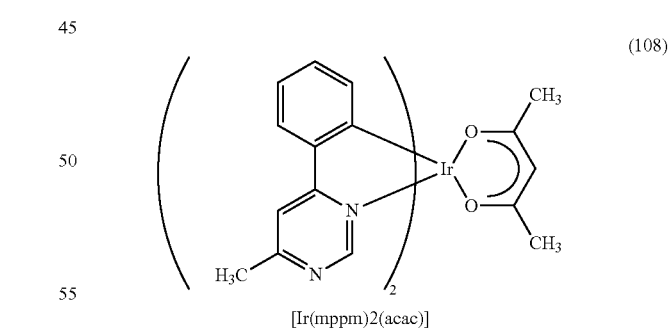

[Ir(mppm)2(acac)] (108)

Next, a third light-emitting layer was formed over the second light-emitting layer. The third light-emitting layer was formed by co-evaporation of 2mDBTPDBq-II and bis(2,3,5-triphenylpyrazinato)(dipivaloylmethanato)iridium(III), (abbrebiation: Ir(tppr)$_2$(dpm); chemical formula: (109)). The thickness of the third light-emitting layer was 20 nm. The weight ratio of 2mDBTPDBq-II to Ir(tppr)$_2$(dpm) was adjusted to 1:0.02 (=2mDBTPDBq-II:Ir(tppr)$_2$(dpm)).

[Chemical Formula 14]

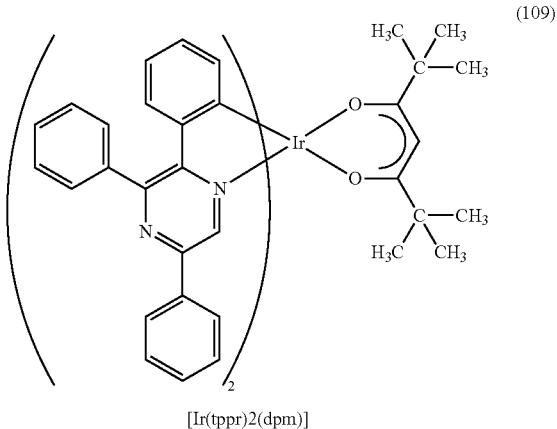

[Ir(tppr)2(dpm)]

Then, 2mDBTPDBq-II was deposited to a thickness of 15 nm as a third electron-transport layer over the third light-emitting layer.

Then, BPhen (abbrebiation) was deposited to a thickness of 15 nm as a fourth electron-transport layer over the third electron-transport layer.

Next, a second charge generation layer was formed over the fourth electron-transport layer. As the second charge generation layer, over the fourth electron-transport layer, Ca, CuPc, and a co-evaporated film of PCzPA and molybdenum oxide (1:0.5=PCzPA:molybdenum oxide in weight ratio) were sequentially deposited to thicknesses of 1 nm, 2 nm, and 10 nm, respectively.

Finally, the second transflective electrode layer was formed by depositing ITO to a thickness of 110 nm. In this manner, the comparative light-emitting element was manufactured.

In the comparative light-emitting element, the reflection electrode layer functions as an anode, and the second transflective electrode layer functions as a cathode.

Figure 8:
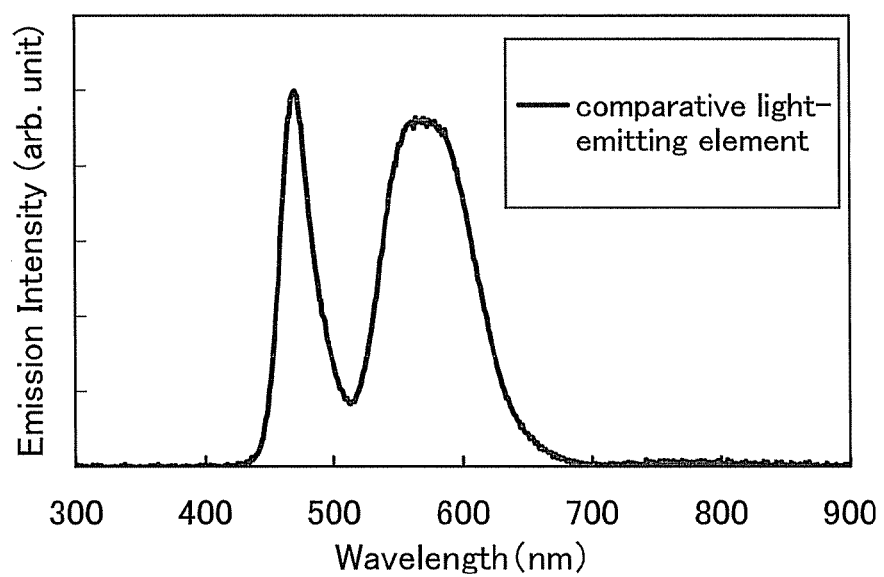
FIG. 8 shows an emission spectrum of a light-emitting element for reference.

Emission spectrum of the comparative light-emitting element is shown in FIG. 8. It is seen from FIG. 8 that the emission spectrum of the comparative light-emitting element has high peaks at 470 nm and 571 nm. Consequently, it is found that the comparative light-emitting element has emission intensities over a wide range of wavelength from 430 nm to 680 nm, whose peaks are broad as a whole.

In this manner, it was able to be confirmed that in Light-emitting Elements 1 to 6 each of which is one embodiment of the present invention, the emission intensity of a desired spectrum can be increased by adjusting the presence and thickness of the transparent electrode layer between the reflection electrode layer and the light-emitting layer, as compared to the comparative light-emitting element.

This application is based on the Japanese Patent Application serial No. 2011-027967 filed with Japan Patent Office on Feb. 11, 2011, the entire contents of which are hereby incorporated by reference.

What is claimed is:

1. A light-emitting device comprising:
a first pixel comprising a first transistor and a first light-emitting element;
a second pixel comprising a second transistor and a second light-emitting element;
a third pixel comprising a third transistor and a third light-emitting element; and
a fourth pixel comprising a fourth transistor and a fourth light-emitting element,
wherein the first light-emitting element comprises:
a first reflection layer over the first transistor;
a light-emitting layer over and in contact with the first reflection layer, the light-emitting layer comprising:
a charge generation layer; and
a hole-injection layer comprising a first organic compound and a second metal oxide; and
a transflective layer over the light-emitting layer,
wherein the second light-emitting element comprises:
a second reflection layer over the second transistor;
a first transparent layer over the second reflection layer;
the light-emitting layer over the first transparent layer; and
the transflective layer over the light-emitting layer,
wherein the third light-emitting element comprises:
a third reflection layer over the third transistor;
a second transparent layer over the third reflection layer;
the light-emitting layer over the second transparent layer; and
the transflective layer over the light-emitting layer,
wherein the fourth light-emitting element comprises:
a fourth reflection layer over the fourth transistor;
a third transparent layer over the fourth reflection layer;
the light-emitting layer over the third transparent layer; and
the transflective layer over the light-emitting layer,
wherein light emitted from the first light-emitting element is blue light,
wherein light emitted from the second light-emitting element is green light,
wherein light emitted from the third light-emitting element is red light,
wherein light emitted from the fourth light-emitting element is yellow light,
wherein the third transparent layer is thicker than the first transparent layer and thinner than the second transparent layer, and
wherein respective thicknesses of the first to third transparent layers are different from each other.

2. The light-emitting device according to claim 1, wherein the light-emitting layer includes at least one of an electron-injection layer, and a plurality of hole-transport layers and electron-transport layers, and
wherein the charge generation layer comprises a second organic compound and a second metal oxide.

3. The light-emitting device according to claim 1, wherein the hole-injection layer includes molybdenum oxide.

4. The light-emitting device according to claim 1, wherein the transflective layer includes at least one of indium oxide, silver, and magnesium.

5. The light-emitting device according to claim 1, wherein the first reflection layer is electrically connected to the first transistor,
wherein the second reflection layer is electrically connected to the second transistor, and
wherein the third reflection layer is electrically connected to the third transistor.

6. The light-emitting device according to claim 1, further comprising:
a first color filter over the first light-emitting element;
a second color filter over the second light-emitting element;

a third color filter over the third light-emitting element; and
a fourth color filter over the fourth light-emitting element,
wherein respective colors of the first to fourth color filters are different from each other.

7. The light-emitting device according to claim 6, further comprising a liquid crystal panel comprising a first substrate, a first electrode, a liquid crystal layer, a second electrode, and a second substrate,
wherein the liquid crystal panel is provided over the first to fourth color filters, and
wherein the light-emitting device enables 3D display.

8. The light-emitting device according to claim 7, further comprising a polarizer interposed between the liquid crystal panel and the first to fourth color filters.

9. An electronic device comprising the light-emitting device according to claim 1.

10. A light-emitting device comprising:
a first pixel comprising a first transistor and a first light-emitting element;
a second pixel comprising a second transistor and a second light-emitting element;
a third pixel comprising a third transistor and a third light-emitting element; and
a fourth pixel comprising a fourth transistor and a fourth light-emitting element,
wherein the first light-emitting element comprises:
a first reflection layer over the first transistor;
a light-emitting layer over and in contact with the first reflection layer, the light-emitting layer comprising:
a first light-emitting layer;
a charge generation layer over the first light-emitting layer; and
a second light-emitting layer over the charge generation layer; and
a transflective layer over the light-emitting layer,
wherein the second light-emitting element comprises:
a second reflection layer over the second transistor;
a first transparent layer over the second reflection layer;
the light-emitting layer over the first transparent layer; and
the transflective layer over the light-emitting layer,
wherein the third light-emitting element comprises:
a third reflection layer over the third transistor;
a second transparent layer over the third reflection layer;
the light-emitting layer over the second transparent layer; and
the transflective layer over the light-emitting layer,
wherein the fourth light-emitting element comprises:
a fourth reflection layer over the fourth transistor;
a third transparent layer over the fourth reflection layer;
the light-emitting layer over the third transparent layer; and
the transflective layer over the light-emitting layer,
wherein light emitted from the first light-emitting element is blue light,
wherein light emitted from the second light-emitting element is green light,
wherein light emitted from the third light-emitting element is red light,
wherein light emitted from the fourth light-emitting element is yellow light,
wherein the third transparent layer is thicker than the first transparent layer and thinner than the second transparent layer, and
wherein respective thicknesses of the first to third transparent layers are different from each other.

11. The light-emitting device according to claim 10,
wherein the charge generation layer comprises an organic compound and a metal oxide.

12. The light-emitting device according to claim 10,
wherein the charge generation layer comprises molybdenum oxide.

13. The light-emitting device according to claim 10,
wherein the transflective layer includes at least one of indium oxide, silver, and magnesium.

14. The light-emitting device according to claim 10,
wherein the first reflection layer is electrically connected to the first transistor,
wherein the second reflection layer is electrically connected to the second transistor, and
wherein the third reflection layer is electrically connected to the third transistor.

15. The light-emitting device according to claim 10, further comprising:
a first color filter over the first light-emitting element;
a second color filter over the second light-emitting element;
a third color filter over the third light-emitting element; and
a fourth color filter over the fourth light-emitting element,
wherein respective colors of the first to fourth color filters are different from each other.

16. The light-emitting device according to claim 10, further comprising a liquid crystal panel comprising a first substrate, a first electrode, a liquid crystal layer, a second electrode, and a second substrate,
wherein the liquid crystal panel is provided over the first to fourth color filters, and
wherein the light-emitting device enables 3D display.

17. The light-emitting device according to claim 16, further comprising a polarizer interposed between the liquid crystal panel and the first to fourth color filters.

18. An electronic device comprising the light-emitting device according to claim 10.

* * * * *